(12) United States Patent
Wu et al.

(10) Patent No.: US 10,483,251 B1
(45) Date of Patent: Nov. 19, 2019

(54) POWER MODULE FOR DRIVETRAIN OF AN ELECTRIC VEHICLE

(71) Applicant: SF Motors, Inc., Santa Clara, CA (US)

(72) Inventors: Tong Wu, Santa Clara, CA (US);
Zhong Nie, Santa Clara, CA (US);
Duanyang Wang, Santa Clara, CA (US)

(73) Assignees: CHONGQING JINKANG NEW ENERGY VEHICLE CO., LTD., Chongqing (CN); SF MOTORS, INC., Santa Clara, CA (US)

( * ) Notice: Subject to any disclaimer, the term of this patent is extended or adjusted under 35 U.S.C. 154(b) by 0 days.

(21) Appl. No.: 16/236,869

(22) Filed: Dec. 31, 2018

Related U.S. Application Data

(60) Provisional application No. 62/758,260, filed on Nov. 9, 2018, provisional application No. 62/758,266, filed on Nov. 9, 2018.

(51) Int. Cl.
*H01L 25/16* (2006.01)
*H01L 23/495* (2006.01)
*B60L 15/00* (2006.01)
*H02M 7/00* (2006.01)
*B60R 16/03* (2006.01)
*H02M 7/5387* (2007.01)

(52) U.S. Cl.
CPC ......... *H01L 25/165* (2013.01); *B60L 15/007* (2013.01); *B60R 16/03* (2013.01); *H01L 23/49531* (2013.01); *H01L 23/49575* (2013.01); *H02M 7/003* (2013.01); *H02M 7/5387* (2013.01)

(58) Field of Classification Search
CPC ............. H01L 25/165; H01L 23/49531; H01L 23/49575; B60L 15/007; B60R 16/03; H02M 7/003; H02M 7/5387
USPC .................................................. 307/9.1, 10.1
See application file for complete search history.

(56) References Cited

U.S. PATENT DOCUMENTS

| 5,617,307 | A | 4/1997 | Guigueno |
| 5,914,577 | A | 6/1999 | Furnival |
| 2001/0014029 | A1 | 8/2001 | Suzuki et al. |
| 2005/0265002 | A1 | 12/2005 | Armstrong et al. |
| 2005/0265059 | A1 | 12/2005 | Tracy et al. |
| 2007/0002594 | A1 | 1/2007 | Otsuka et al. |
| 2007/0109715 | A1 | 5/2007 | Azuma et al. |

(Continued)

OTHER PUBLICATIONS

Notice of Allowance on U.S. Appl. No. 16/236,862 dated Jun. 7, 2019.

*Primary Examiner* — Hal Kaplan
(74) *Attorney, Agent, or Firm* — Foley & Lardner LLP; James De Vellis

(57) ABSTRACT

Provided herein are systems and methods described related to a power module of a drivetrain system of an electric vehicle. The power modules as described herein can include a sandwich structure that reduces a parasitic inductance of the power module through mutual inductance cancellation. For example, the power modules can include at least two current paths that overlap or are formed over each other in a sandwich like formation to form a power loop having an overlapping current path. The power loop can have an overall inductance value corresponding to a self-inductance of the first current path and a self-inductance of the second current path subtracted by a mutual inductance value of the overlapping current path.

20 Claims, 15 Drawing Sheets

(56) References Cited

U.S. PATENT DOCUMENTS

| | | |
|---|---|---|
| 2008/0225487 A1 | 9/2008 | Nakajima et al. |
| 2008/0316710 A1 | 12/2008 | Seto et al. |
| 2009/0016018 A1 | 1/2009 | Kunkle |
| 2009/0040724 A1 | 2/2009 | Nishikimi et al. |
| 2011/0122669 A1 | 5/2011 | Santos |
| 2011/0156797 A1 | 6/2011 | Ninomiya et al. |
| 2011/0286185 A1 | 11/2011 | Abe et al. |
| 2013/0039008 A1 | 2/2013 | Hoffmann et al. |
| 2013/0235530 A1 | 9/2013 | Drofenik et al. |
| 2013/0271941 A1 | 10/2013 | Guan et al. |
| 2013/0312931 A1 | 11/2013 | Sharaf et al. |
| 2013/0322016 A1 | 12/2013 | Jones et al. |
| 2014/0098588 A1 | 4/2014 | Kaneko et al. |
| 2014/0168900 A1 | 6/2014 | Korich et al. |
| 2014/0355324 A1 | 12/2014 | Kontani |
| 2015/0340966 A1 | 11/2015 | Mutsuura et al. |
| 2015/0349661 A1 | 12/2015 | Kunin et al. |
| 2016/0037677 A1 | 2/2016 | Yamanaka et al. |
| 2017/0093302 A1* | 3/2017 | Rowden ................ H02M 7/537 |
| 2019/0052154 A1 | 2/2019 | Sugiura |

* cited by examiner

POWER MODULE FOR DRIVETRAIN OF AN ELECTRIC VEHICLE

CROSS REFERENCE TO RELATED APPLICATIONS

The present application claims the benefit of priority under 35 U.S.C. § 119(E) TO U.S. provisional application 62/758,260, titled "POWER MODULE FOR DRIVETRAIN OF AN ELECTRIC VEHICLE", filed on Nov. 9, 2018 and claims the benefit of priority under 35 U.S.C. § 119(E) TO U.S. provisional application 62/758,266, titled "INVERTER MODULE FOR DRIVETRAIN OF AN ELECTRIC VEHICLE", filed on Nov. 9, 2018. The entire disclosure of both are incorporated herein by reference in their entireties.

BACKGROUND

Inverters can include electrochemical materials to supply electrical power to electrical components connected thereto. Such inverters can provide electrical energy to electrical systems.

SUMMARY

At least one aspect is directed to a power module for a drivetrain of an electric vehicle. The power module can include a first polarity terminal having a first surface and a second surface. The power module can include an isolation layer having a first surface and a second surface. The first surface of the isolation layer can couple with the second surface of the first polarity terminal. The power module can include a second polarity terminal having a first surface and a second surface. The first surface of the second polarity terminal can couple with the second surface of the isolation layer. The power module can include a high side switch. The power module can include a first current path electrically couples the first polarity terminal to the high side switch. The power module can include a low side switch. The power module can include a second current path electrically couples the second polarity terminal to the low side switch. The power module can include a power loop formed from the first current path and the second current path. The power module can include the power loop having an overlapping current path formed from the first current path disposed parallel with respect to the second current path with the first polarity terminal of the first current path disposed parallel with respect to the second polarity terminal of the second current path. The power loop can have an overall inductance value corresponding to a self-inductance of the first current path and a self-inductance of the second current path subtracted by a mutual inductance value of the overlapping current path.

In at least one aspect, a method of providing a power module for a drivetrain of an electric vehicle is provided. The method can include providing a first polarity terminal having a first surface and a second surface. The method can include disposing an isolation layer having a first surface and a second surface such that the first surface of the isolation layer is coupled with the second surface of the first polarity terminal. The method can include coupling a second polarity terminal having a first surface and a second surface such that the first surface of the second polarity terminal is coupled with the second surface of the isolation layer. The method can include providing a high side switch. The method can include electrically coupling the first polarity terminal to the high side switch through a first current path. The method can include providing a low side switch. The method can include electrically coupling the second polarity terminal to the low side switch through a second current path. The method can include forming a power loop from the first current path and the second current path. The method can include the power loop having an overlapping current path formed from the first current path disposed parallel with respect to the second current path with the first polarity terminal of the first current path disposed parallel with respect to the second polarity terminal of the second current path. The method can include the power loop having an overall inductance value corresponding to a self-inductance of the first current path and a self-inductance of the second current path subtracted by a mutual inductance value of the overlapping current path.

In at least one aspect, a method is provided. The method can include providing a power module for a drivetrain of an electric vehicle. The power module can include a first polarity terminal having a first surface and a second surface. The power module can include an isolation layer having a first surface and a second surface. The first surface of the isolation layer can couple with the second surface of the first polarity terminal. The power module can include a second polarity terminal having a first surface and a second surface. The first surface of the second polarity terminal can couple with the second surface of the isolation layer. The power module can include a high side switch. The power module can include a first current path electrically couples the first polarity terminal to the high side switch. The power module can include a low side switch. The power module can include a second current path electrically couples the second polarity terminal to the low side switch. The power module can include a power loop formed from the first current path and the second current path. The power module can include the power loop having an overlapping current path formed from the first current path disposed parallel with respect to the second current path with the first polarity terminal of the first current path disposed parallel with respect to the second polarity terminal of the second current path. The power loop can have an overall inductance value corresponding to a self-inductance of the first current path and a self-inductance of the second current path subtracted by a mutual inductance value of the overlapping current path.

In at least one aspect, an electric vehicle is provided. The electric vehicle can include a power module for a drivetrain of an electric vehicle. The power module can include a first polarity terminal having a first surface and a second surface. The power module can include an isolation layer having a first surface and a second surface. The first surface of the isolation layer can couple with the second surface of the first polarity terminal. The power module can include a second polarity terminal having a first surface and a second surface. The first surface of the second polarity terminal can couple with the second surface of the isolation layer. The power module can include a high side switch. The power module can include a first current path electrically couples the first polarity terminal to the high side switch. The power module can include a low side switch. The power module can include a second current path electrically couples the second polarity terminal to the low side switch. The power module can include a power loop formed from the first current path and the second current path. The power module can include the power loop having an overlapping current path formed from the first current path disposed parallel with respect to the second current path with the first polarity terminal of the first current path disposed parallel with respect to the second polarity terminal of the second current path. The power loop can have an overall inductance value corresponding to a self-inductance of the first current path and a self-inductance of the second current path subtracted by a mutual inductance value of the overlapping current path.

In at least one aspect, an inverter module for a drivetrain of an electric vehicle is provided. The inverter module can include a capacitor having a first side and a second side. The inverter module can include a first heat sink coupled with the first side of the capacitor. The inverter module can include a second heat sink coupled with the second side of the capacitor. The inverter module can include a first row of power modules coupled with the first side of the capacitor. The first row of power modules can be disposed over the first heat sink. The inverter module can include a second row of power modules coupled with the second side of the capacitor. The second row of power modules can be disposed over the second heat sink. The inverter module can include each of the power modules having at least one first polarity terminal coupled with a first terminal of the capacitor. The inverter module can include each of the power modules having at least one second polarity terminal coupled with a second terminal of the capacitor. The inverter module can include each of the power modules having output terminals coupled with at least one phase output terminal of the inverter module. The inverter module can include the power modules coupled in a parallel arrangement with the capacitor.

In at least one aspect, a method of providing an inverter module for a drivetrain of an electric vehicle is provided. The method can include providing a capacitor having a first side and a second side. The method can include coupling a first heat sink with the first side of the capacitor. The method can include coupling a second heat sink with the second side of the capacitor. The method can include disposing a first row of power modules over the first heat sink. The first row of power modules can couple with the first side of the capacitor. The method can include disposing a second row of power modules over the second heat sink. The second row of power modules can couple with the second side of the capacitor. The method can include positioning at least one first polarity terminal of each of the power modules in contact with a first terminal of the capacitor. The method can include positioning at least one second polarity terminal of each of the power modules in contact with a second terminal of the capacitor. The method can include coupling output terminals of each of the power modules with at least one phase output terminal of the inverter module. The method can include coupling the power modules coupled in a parallel arrangement with the capacitor.

In at least one aspect, a method is provided. The method can include providing an inverter module for a drivetrain of an electric vehicle. The inverter module can include a capacitor having a first side and a second side. The inverter module can include a first heat sink coupled with the first side of the capacitor. The inverter module can include a second heat sink coupled with the second side of the capacitor. The inverter module can include a first row of power modules coupled with the first side of the capacitor. The first row of power modules can be disposed over the first heat sink. The inverter module can include a second row of power modules coupled with the second side of the capacitor. The second row of power modules can be disposed over the second heat sink. The inverter module can include each of the power modules having at least one first polarity terminal coupled with a first terminal of the capacitor. The inverter module can include each of the power modules having at least one second polarity terminal coupled with a second terminal of the capacitor. The inverter module can include each of the power modules having output terminals coupled with at least one phase output terminal of the inverter module. The inverter module can include the power modules coupled in a parallel arrangement with the capacitor.

In at least one aspect, an electric vehicle is provided. The electric vehicle can include an inverter module for a drivetrain of an electric vehicle. The inverter module can include a capacitor having a first side and a second side. The inverter module can include a first heat sink coupled with the first side of the capacitor. The inverter module can include a second heat sink coupled with the second side of the capacitor. The inverter module can include a first row of power modules coupled with the first side of the capacitor. The first row of power modules can be disposed over the first heat sink. The inverter module can include a second row of power modules coupled with the second side of the capacitor. The second row of power modules can be disposed over the second heat sink. The inverter module can include each of the power modules having at least one first polarity terminal coupled with a first terminal of the capacitor. The inverter module can include each of the power modules having at least one second polarity terminal coupled with a second terminal of the capacitor. The inverter module can include each of the power modules having output terminals coupled with at least one phase output terminal of the inverter module. The inverter module can include the power modules coupled in a parallel arrangement with the capacitor.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing. In the drawings.

DETAILED DESCRIPTION

Following below are more detailed descriptions of various concepts related to, and implementations of power modules for drivetrain systems in electric vehicles. The various concepts introduced above and discussed in greater detail below can be implemented in any of numerous ways.

Systems and methods described herein relate to a power module of a drivetrain system of an electric vehicle. The power modules as described herein can include a sandwich structure that reduces a parasitic inductance of the power module through mutual inductance cancellation. For example, the power modules can include at least two current paths that overlap or are formed over each other in a sandwich like formation to form a power loop having an overlapping current path. The overlapping current path of the two current paths can reduce or otherwise eliminate the self-inductances of the two individual current paths through mutual inductance.

Systems and methods described herein relate to an inverter module of a drivetrain system of an electric vehicle. The inverter module can include multiple power modules to form a three phase inverter module to power an electric vehicle. The power modules can be arranged or organized within the inverter module to reduce a footprint of the inverter module and reduce an inductance of the inverter module. For example, the power modules can be arranged within the inverter module in a row like or queue like formation such that a first row of power modules is disposed along a first side of the inverter module and a second row of power modules is disposed along a second side of the inverter module. In such an arrangement, the power modules can be positioned the same distance from a capacitor element of the inverter module. The first and second polarity terminals of each of the power modules can be aligned along the respective rows of the power modules to provide ease for assembly. The alignment of the power modules forming the inverter module can thus provide a small footprint and reduce the size of the inverter module. The positioning of the power modules can reduce an inductance value of the paralleled power loop formed by the multiple power modules, thus reducing an inductance of the inverter module.

Figure 1:
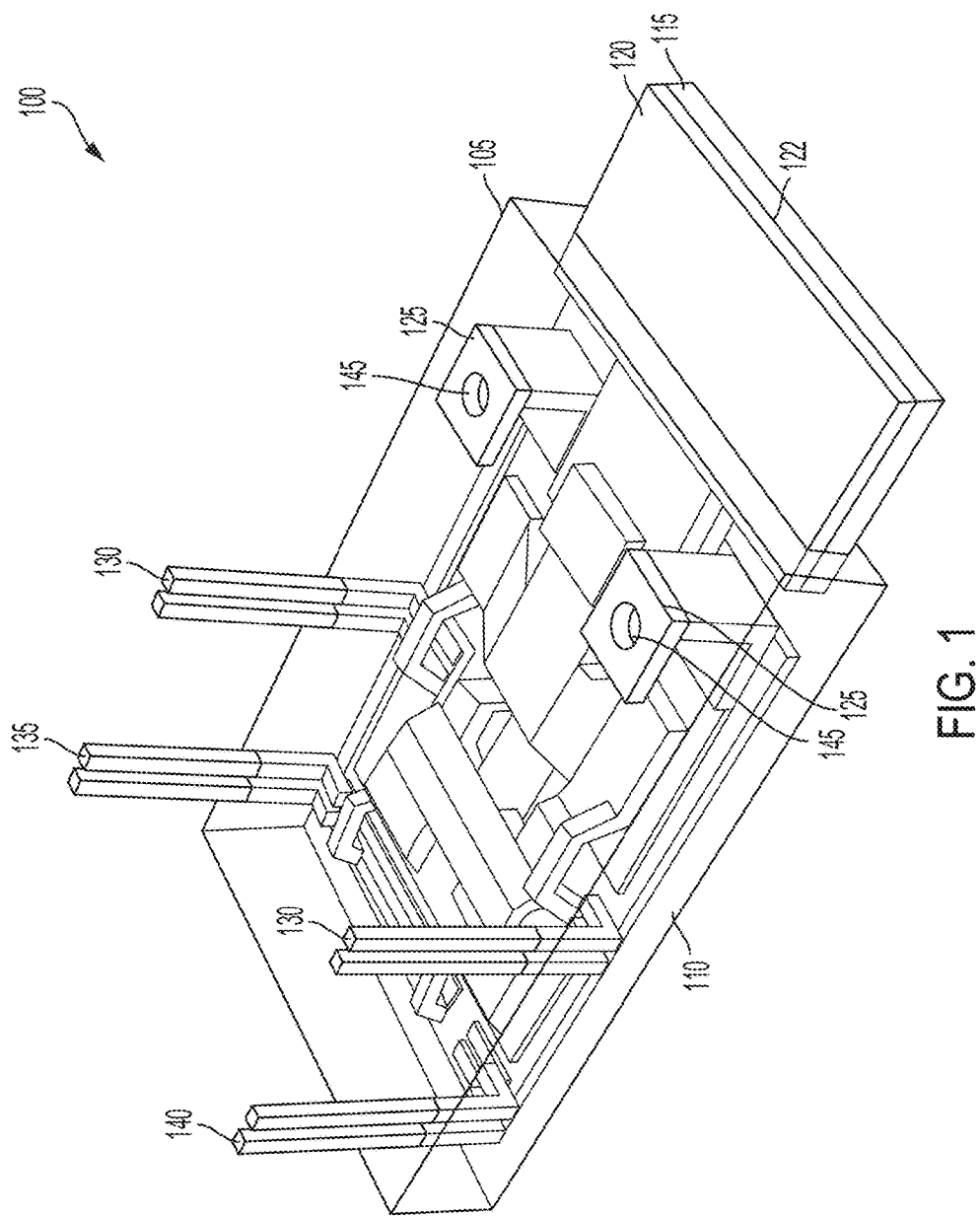
FIG. 1 is a diagram depicting a cross-sectional view of a power module for a drivetrain an electric vehicle, according to an illustrative implementation.

FIG. 1, among others, depicts a cross-sectional view 100 of a power module 105. The power module 105 can be formed as or include a 2-in-1 phase leg module design. The 2-in-1 phase leg design can provide an integrated solution having interconnection leads packaged within the respective power module 105. For example, the power module 105 can be formed as or include a sandwich phase-leg silicon carbide (SiC) power module. The power module 105 can be a component of a drivetrain of an electric vehicle to control a power or energy flow between an energy storage system (e.g., battery pack) to an electric motor of the electric vehicle. The power module 105 can include a housing 110. The housing 110 can be formed around one or more outer surfaces of the power module 105. For example, the housing 110 can be formed around two or more sides or edge surfaces forming the outer surface of the power module 105. The housing 110 can be formed over a first outer surface and four edge outer surfaces of the power module 105 and include an open area (e.g., exposed area) to expose terminals and components (e.g., output terminals, gate terminals) of the power module 105 for coupling with other components of a drivetrain of an electric vehicle. The housing 110 can hold, house or support components of the power module 105. For example, the housing 110 can server as a casing to hold the components of the power module 105. The housing 110 can be formed through transfer molding techniques. For example, the housing 110 can include a transfer molded package that is formed around one or more outer surfaces of the power module 105. The housing 110 can include a lead frame design. For example, the housing 110 can include a lead frame that provides a surface to electrically connect or physically connect the different components of the power module with each other. The housing 110 can be manufactured using a lead frame and silicone gel. The housing 110 can include non-conductive material, polymer material (e.g., thermoset polymer), resin material, epoxy resins, or aluminum material.

The power module 105 can include a first polarity terminal 115 (e.g., positive terminal). The first polarity terminal 115 can correspond to a positive terminal of the power module 105. The first polarity terminal 115 can correspond to a negative terminal of the power module 105. The first polarity terminal 115 can include or be formed from conductive material, such as but not limited to, metal material, metallic material, or copper. For example, the first polarity terminal 115 can receive an input (e.g., input voltage, input current) having a first polarity and provide the input to the power module 105 to generate an output (e.g., output voltage, output current). The first polarity terminal 115 can be formed such that the first polarity terminal 115 extends from at least one side or at least one edge of the power module 105. For example, the first polarity terminal 115 can couple with a first side or first edge of the power module 105 and housing 110. A portion of the first polarity terminal 115 can extend from the first side or the first edge of the power module 105 and housing 110 such that the portion of the first polarity terminal 115 is exposed. For example, the exposed surface of the first polarity terminal 115 can provide a connection point to couple a first polarity power source (e.g., battery pack, first polarity busbar) with the power module 105. The first polarity terminal 115 can be formed having flat or planar surfaces for coupling with other components of the electric vehicle.

The power module 105 can include a second polarity terminal 120 (e.g., negative terminal). The second polarity terminal 120 can correspond to a negative terminal of the power module 105. The second polarity terminal 120 can correspond to a positive terminal of the power module 105. For example, the second polarity terminal 120 can be an opposite polarity of the first polarity terminal 115. The second polarity terminal 120 can include or be formed from conductive material, such as but not limited to, metal material, metallic material, or copper. For example, the second polarity terminal 120 can receive an input (e.g., input voltage, input current) having a second polarity and provide the input to the power module 105 to generate an output (e.g., output voltage, output current). The second polarity terminal 120 can be formed such that the second polarity terminal 120 extends from at least one side or at least one edge of the power module 105. For example, the second polarity terminal 120 can couple with a first side or first edge of the power module 105 and housing 110. The second polarity terminal 120 can be formed such that it extends from the same side or same edge of the power module 105 and housing 110 as the first polarity terminal 115. A portion of the second polarity terminal 120 can extend from the first side or the first edge of the power module 105 and housing 110 such that the portion of the second polarity terminal 120 is exposed. For example, the exposed surface of the second polarity terminal 120 can provide a connection point to couple a second polarity power source (e.g., battery pack, second polarity busbar) with the power module 105. The second polarity terminal 120 can be formed having flat or planar surfaces for coupling with other components of the electric vehicle.

An isolation layer 122 can be disposed between the first polarity terminal 115 and the second polarity terminal 120. For example, the isolation layer 122 can electrically isolate or electrically insulate the first polarity terminal 115 from the second polarity terminal 120. The isolation layer 122 can include non-conductive material, such as but not limited to, a polymer material, insulation material, plastic material, glass material, ceramic material or epoxy material. The first polarity terminal 115 and the second polarity terminal 120 can be positioned having a sandwich relationship with respect to each other such that the first polarity terminal 115 is positioned over or under the second polarity terminal 120 and parallel with respect to the second polarity terminal 120. For example, the first polarity terminal 115 can be disposed over or in contact with the isolation layer 122. At least one surface or portion of the first polarity terminal 115 can be in direct contact with at least one surface or portion of the isolation layer 122. The isolation layer 122 can be disposed over or in contact with the second polarity terminal 120. At least one surface or portion of the isolation layer 122 can be in direct contact with at least one surface or portion of the second polarity terminal 120. Thus, the first polarity terminal 115, isolation layer 122, and the second polarity terminal 120 can be disposed having a vertical alignment with respect to each other and parallel with respect to each other. The vertical alignment of the first polarity terminal 115, isolation layer 122, and the second polarity terminal 120 can provide a smaller footprint within the power module 105 and thus, aid in reducing the overall dimensions or footprint of the power module 105 itself.

The power module 105 can include at least one output terminal 125. For example, and as depicted in FIG. 1, the power module 105 can include two output terminals 125. The output terminals 125 can be formed having a "c" shape. For example, the output terminals 125 can include two planar surfaces connected by a vertical surface. The first planar surface (e.g., bottom planar surface) can couple the respective output terminal 125 with the power module 105. For example, the first planar surface can be in contact with or coupled with a trace substrate (e.g., trace substrate 220) of the power module 105 to electrically couple the output terminal 125 with the power module 105. The second planar surface (e.g., top planar surface) can couple the respective output terminal 125 with a phase output of an inverter module. For example, the second planar surface can be exposed from the housing 110 to provide a connection point to couple the power module 105 with a phase output of an inverter module, an electric motor or other power device within the electric vehicle. The output terminals 125 can include at least one orifice 145 to receive a bolt or connector to couple the respective output terminal 125 with a phase output of an inverter module. The orifice 145 can include a hole or opening formed through at least one surface of the respective output terminal 125. The output terminals 125 can be formed from conductive material, such as but not limited to, metal material, metallic material or copper.

The power module 105 can include at least one low gate terminal 130. The power module 105 can include at least two low gate terminals 130. For example, the power module 105 can include a first low gate terminal 130 coupled with a pair of switching devices (e.g., switches 235 of FIG. 2) and a second low gate terminal 130 coupled with a pair of switching devices (e.g., switches 235 of FIG. 2). The low gate terminals 130 can couple with at least one low side switch. The low gate terminals 130 can couple with a pair of low side switches (e.g., paralleled low side switches). The low gate terminals 130 can provide signals to and from switches of the power module 105 to a printed control board (PCB) or gate driver circuit. For example, the low gate terminals 130 can include a first end that couples with a low side switch (e.g., gate terminal of a low side switch 235 of FIG. 2) of the power module 105 and a second end that couples with a PCB or gate driver circuit of an inverter module. The low gate terminals 130 can form an electrical pathway from the respective low side switch to the PCB or gate driver circuit. The low gate terminals 130 can provide electrical signals corresponding to control signals to control operation of the respective low side switch. The low gate terminals 130 can provide electrical signals corresponding to status signals of a low side switch to the PCB or gate driver circuit. The low gate terminals 130 can be formed from conductive material, such as but not limited to, metal material, metallic material or copper.

The power module 105 can include at least one high gate terminal 135. The power module 105 can include at least two high gate terminals 135. For example, the power module 105 can include a first high gate terminal 135 coupled with a pair of switching devices (e.g., switches 225 of FIG. 2) and a second high gate terminal 135 coupled with a pair of switching devices (e.g., switches 225 of FIG. 2). The high gate terminals 135 can couple with at least one high side switch. The high gate terminals 135 can couple with a pair of high side switches (e.g., paralleled high side switches). The high gate terminal 135 can provide signals to and from switches of the power module 105 to a printed control board (PCB) or gate driver circuit. For example, the high gate terminal 135 can include a first end that couples with a high side switch (e.g., gate terminal of high side switch) of the power module 105 and a second end that couples with a PCB or gate driver circuit of an inverter module. The high gate terminal 135 can form an electrical pathway from the high side switch to the PCB or gate driver circuit. The high gate terminal 135 can provide electrical signals corresponding to control signals to control operation of the respective high side switch. The high gate terminal 135 can provide electrical signals corresponding to status signals of a high side switch to the PCB or gate driver circuit. The high gate terminal 135 can be formed from conductive material, such as but not limited to, metal material, metallic material or copper.

The power module 105 can include a temperature terminal 140. The temperature terminal 140 can include a first end that couples with an interior surface or component within the power module 105 (e.g., trace substrate 220) and a second end that couples with a PCB or gate driver circuit of an inverter module. The temperature terminal 140 can provide temperature data corresponding to an environment within the power module 105 or corresponding to one or more components of the power module 105 to the PCB or gate driver circuit. The temperature terminal 140 can be formed from conductive material, such as but not limited to, metal material, metallic material or copper. The temperature terminal 140 can be disposed adjacent to, next to, or proximate to at least one high gate terminal 135 of the power module 105.

The dimensions of the power module 105 can vary and can be selected based at least in part on the dimensions of an inverter module the power module 105 is to be disposed within. For example, the power module 105 can have a length in a range from 30 mm to 52 mm (e.g., 42 mm). The length of the power module 105 can vary within or outside this range. The power module 105 can have a width in a range from 22 mm to 32 mm (e.g., 28 mm). The width of the power module 105 can vary within or outside this range. The power module 105 can be formed having a square shape or a rectangualr rectangular shape. The sandwich alignment of the first polarity terminal 115 and second polarity terminal 120 can further reduce the footprint and dimensions of the power module 105. For example, the width of two terminals can be reduced by half as the first polarity terminal 115 and second polarity terminal 120 are aligned with respect to each other and creates space to place phase output terminals 125 at the same side without increasing the footprint of the power module 105. The sintered interfaces can provide thermal resistance through the power module 105.

Figure 2:
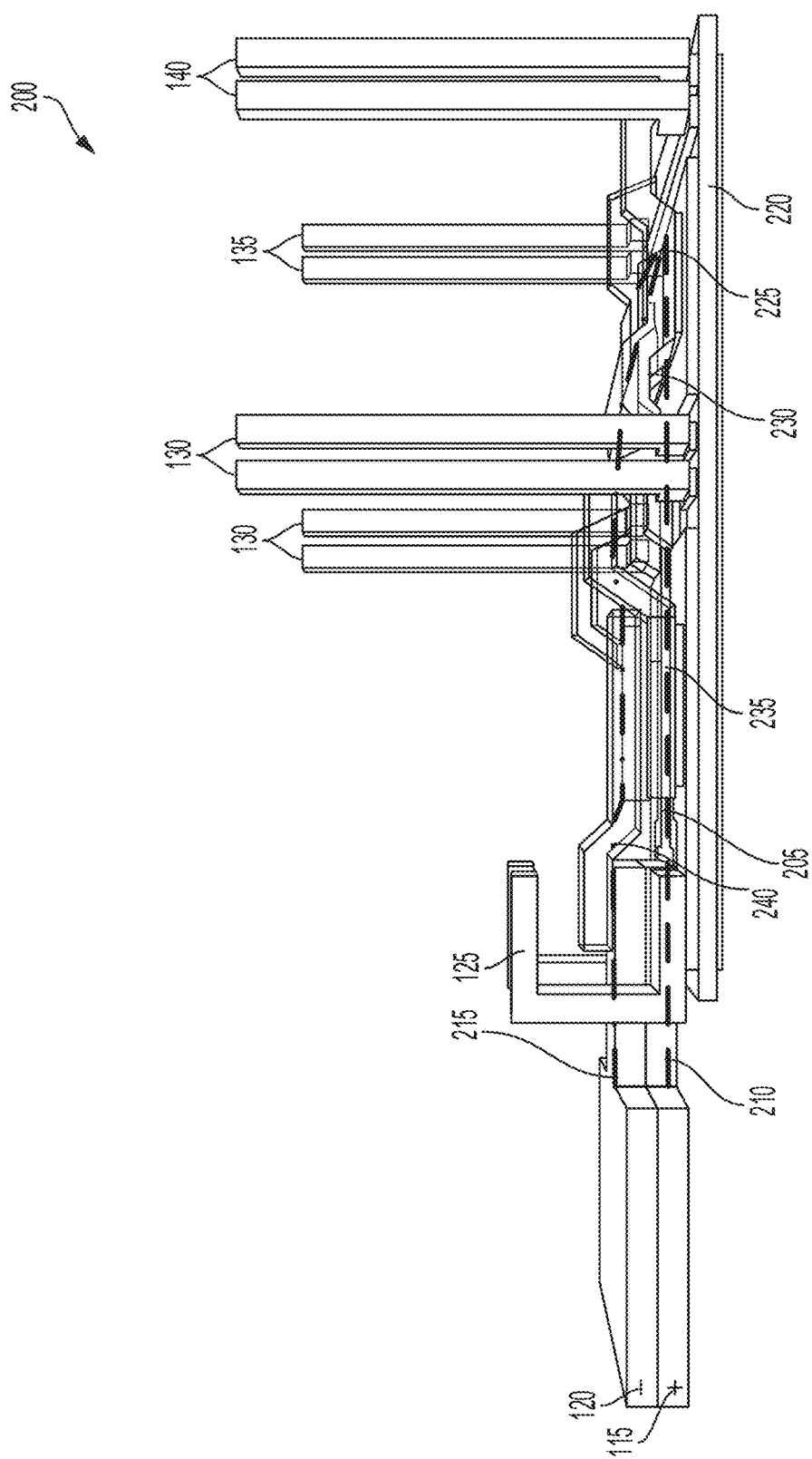
FIG. 2 is a diagram depicting a side view of a power module for a drivetrain of an electric vehicle, according to an illustrative implementation.

FIG. 2, among others, depicts a side view 200 of the power module 105. The side view 200 illustrates the sandwich structure or overlapping relationship of the different components of the power module 105 with the different layers coupled with each other or positioned having a close proximity to each other. For example, the first polarity terminal 115 can form a first end or starting point for a power loop 205 (e.g., commutation loop) of the power module 105 and the second polarity terminal 120 can form an end point or ending point for the power loop 205 of the power module 105. The power loop 205 of the power module 105 can include a first current path 210 (or first portion) and a second current path 215 (or second portion) that together form the power loop 205 of the power module 105. The power loop 205 can form or have a shape corresponding to an overlapping current path through the power module 105 to reduce the parasitic inductance of the power module 105. For example, the second current path 215 can be positioned, formed or aligned over the first current path 210 to form the overlapping current path of the power loop 205. The first current path 210 can be positioned, formed or aligned over the second current path 215 to form the overlapping current path of the power loop 205. By having an overlapping current path, a self-inductance value of the first current path 210 can be canceled or otherwise reduced by a self-inductance value of the second current path 215 through a mutual inductance value of the overlapping current path of the power loop 205. For example, the mutual inductance value of the power loop 205 can correspond to the interaction between the self-inductance values of the first current path 210 and the second current path 215. An overall inductance value of the power loop 205 can be equal to the self-inductance value of the first current path 210 plus the self-inductance value of the second current path 215 minus (e.g., subtracted) two times the mutual inductance value of the power loop 205 (e.g., $L=L_{self\_1}+L_{self\_2}-2L_{mutual}$). The power loop 205 can have an overall inductance value corresponding to a self-inductance of the first current path 210 combined with (e.g., added) a self-inductance of the second current path 215 and the combination of the self-inductance of the first current path 210 and the self-inductance of the second current path 215 subtracted by a mutual inductance value of the overlapping current path. Thus, the first current path 210 and the second current path 215 can be formed and positioned to reduce or cancel the overall inductance value of the power module 105. For example, by having the second current path 215 positioned as overlapping the first current path 210 and thus, forming a return portion of the power loop 205, the mutual inductance value of the power loop 205 can be increased or maximized and the overall inductance of the power loop 205 can be reduced.

The power loop 205 can begin at the first polarity terminal 115. The first polarity terminal 115 can be in contact with and electrically coupled with a trace substrate 220. For example, the first polarity terminal 115 can contact the trace substrate 220. The first polarity terminal 115 can couple with the trace substrate 220 through a conductive material or conductive adhesive. The trace substrate 220 can be disposed along a bottom surface of the power module 105 to form an electrical pathway within the power module 105. For example, the trace substrate 220 can conduct current within the power module 105. The trace substrate 220 can include a conductive material, such as but not limited to, metal material, a metallic material, a copper material, or a direct bonded copper (DBC) trace. The trace substrate 220 can provide an input received at the first polarity terminal 115 to a second component of the power module 105. For example, the trace substrate 220 can electrically couple the first polarity terminal 115 with a high side switch 225. The trace substrate 220 can provide an input (e.g., input voltage, input current) received at the first polarity terminal 115 to at least one terminal of the high side switch 225. For example, the trace substrate 220 can couple with a drain terminal of the high side switch 225 to provide an input from the first polarity terminal 115 to the high side switch 225. The trace substrate 220 can couple with a source terminal of the high side switch 225 to provide an input from the first polarity terminal 115 to the high side switch 225.

The power module 105 can include at least one high side switch 225. The power module 105 can include two high side switches 225 coupled in a parallel arrangement. The power module 105 can include more than two high side switches 225 with the high side switches 225 grouped into pairs having two high side switches 225 coupled in a parallel arrangement. The high side switch 225 can correspond to switching elements within the power module 105 to control operation and output of the respective power module 105. The high side switch 225 can correspond to one or more switching elements (e.g., two switching elements, four switching elements) coupled between the first polarity terminal 115 of the power module 105 and an output terminal 125 (e.g., common mode terminal) of the power module 105. Thus, the high side switch 225 can control output of half a portion or half a leg of a circuit (e.g., circuit 300 of FIG. 3) forming the power module 105. For example, the high side switch 225 of FIG. 2 can correspond to at least one switch position of a circuit schematic (e.g., switching element 340 of circuit schematic 300 of FIG. 3) of the power module 105. The high side switch 225, also referred to herein as a switch position, can include four paralleled transistor devices, for example, four insulated gate bipolar transistors (IGBT), or four MOSFETs coupled with each other in a paralleled arrangement. A switch position, here the high side switch position, can include two paralleled transistor devices, for example, two insulated gate bipolar transistors (IGBT), or two MOSFETs coupled with each other in a paralleled arrangement. The high side switch 225 can couple with at least one high gate terminal 135 to receive a control signal. For example, the high gate terminal 135 can couple with a gate terminal of each of the high side switches 225 forming the respective high side switch 225. A first high gate terminal 135 can couple with a gate terminal of a first high side switch 225, a gate terminal of a second high side switch 225, a gate terminal of a third high side switch 225, and a gate terminal of a fourth high side switch 225. A first high gate terminal 135 can couple with a gate terminal of a first high side switch 225 and a gate terminal of a second high side switch 225 and a second high gate terminal 135 can couple with a gate terminal of a third high side switch 225 and a gate terminal of a fourth high side switch 225.

The high side switch 225 can electrically couple with a high side connector 230. For example, the high side switch 225 can be in contact with the high side connector 230. The high side connector 230 can include at least one end or surface that couples with or contacts at least one surface or connection point of the high side switch 225. The high side switch 225 can electrically couple with the high side connector 230 through a conductive material or conductive adhesive. The power module 105 can include at least one high side connector 230. The power module 105 can include two high side connectors 230. The power module 105 can include more than two high side connectors 230 with the amount of high side connectors 230 selected based in part on a number of high side switches 225. The high side connector 230 can include a connection device, for example, a high side clip or clip connector. The high side connector 230 can include conductive material, such as not limited to metallic material, metal material, or copper. The high side connector 230 can electrically connect the high side switch 225 with an output terminal (e.g., common mode terminal) of the power module and a low side switch 235. For example, the high side connector 230 can include a first end coupled with the high side switch 225 (or multiple high side switches 225) and a second end coupled with a surface of an output terminal 125. The high side connector 230 can provide an output signal from at least one terminal of a high side switch 225 to the output terminal 125. For example, the high side connector 230 can provide an output signal from a source terminal of a high side switch 225 to the output terminal 125. The high side connector 230 can provide an output signal from a drain terminal of a high side switch 225 to the output terminal 125. The high side connector 230 can couple with a low side switch 235 and serve as a transition point between the first current path 210 and the second current path 215. The high side connector 230 can correspond to a point where the power loop 205 transitions from the first current path 210 to the second current path 215 and the second current path 215 begins to overlap the first current path 210. For example, the high side connector 230 can include at least one end coupled with the high side switch 225 (or multiple high side switches 225), at least one end coupled with a low side switch 235 (or multiple low side switches 235, and at least one end coupled with a surface of an output terminal 125 (or a surface of two output terminals 125).

The power module 105 can include at least one low side switch 235. The power module 105 can include two low side switches 235 coupled in a parallel arrangement. The power module 105 can include more than two low side switches 235 with the low side switches 235 grouped into pairs having two low side switches 235 coupled in a parallel arrangement. The low side switch 235 can correspond to switching elements within the power module 105 to control operation and output of the respective power module 105. The low side switch 235 can correspond to a switching element (e.g., two switching elements, four switching elements) coupled between the output terminal (e.g., common mode terminal) of the power module 105 and the second polarity terminal 120 of the power module 105. Thus, the low switch 235 can control output of half a portion or half a leg of a circuit (e.g., switching element 365 of circuit 300 of FIG. 3) forming the power module 105. For example, the low side switch 235 of FIG. 2 can correspond to at least one switch position of a circuit schematic (e.g., circuit schematic 300 of FIG. 3) of the power module 105. The low side switch 235, also referred to herein as a switch position, can include four paralleled transistor devices, for example, four insulated gate bipolar transistors (IGBT), or four MOSFETs coupled with each other in a paralleled arrangement. A switch position, here the low side switch position, can include two paralleled transistor devices, for example, two insulated gate bipolar transistors (IGBT), or two MOSFETs coupled with each other in a paralleled arrangement. The low side switch 235 can couple with at least one low gate terminal 130 to receive a control signal. For example, the low gate terminal 130 can couple with a gate terminal of each of the low side switches 235 forming the respective low side switch 235. A first low gate terminal 130 can couple with a gate terminal of a high side switch 225, a gate terminal of a second low side switch 235, a gate terminal of a third low side switch 235, and a gate terminal of a fourth low side switch 235. A first low gate terminal 130 can couple with a gate terminal of a first low side switch 235 and a gate terminal of a second low side switch 235 and a second low gate terminal 130 can couple with a gate terminal of a third low side switch 235 and a gate terminal of a fourth low side switch 235.

The low side switch 235 can be electrically coupled with a low side connector 240. The power module 105 can include at least one low side connector 240. For example, the low side switch 235 can be in contact with the low side connector 240. The low side connector 240 can include at least one end or surface that couples with or contacts at least one surface or connection point of the low side switch 235. The low side switch 235 can electrically couple with the low side connector 240 through a conductive material or conductive adhesive. The power module 105 can include at least one low side connector 240. The power module 105 can include two low side connectors 240. The power module 105 can include more than two low side connectors 240 with the amount of low side connectors 240 selected based in part on a number of low side switches 235. The low side connector 240 can include a connection device, for example, a low side clip or clip connector. The low side connector 240 can include conductive material, such as not limited to metallic material, metal material, or copper. The low side connector 240 can electrically connect the low side switch 235 with the second polarity terminal 120 of the power module 105. For example, at least one end of the low side connector 240 can couple with at least one terminal of the low side switch 235 and at least one end of the low side connector 240 can couple with the second polarity terminal 120. The low side connector 240 can include a first end coupled with a drain terminal of the low side switch 235. The low side connector 240 can include a second end coupled with a source terminal of the low side switch 235. The low side connector 240 can electrically connect the low side switch 235 with the second polarity terminal 120 through the trace substrate 220. For example, each of the low side switch 235, the low side connector 240, and the second polarity terminal 120 can couple with a portion of the trace substrate 220. The portion of the trace substrate 220 can form an electrical pathway to pass an input (e.g., input voltage, input current) received at the second polarity terminal 120 to the low side connector 240 and to the low side switch 235. The trace substrate 220 can provide an input (e.g., input voltage, input current) received at the second polarity terminal 120 to at least one terminal of the low side switch 235. For example, the trace substrate 220 can couple with a drain terminal of the low side switch 235 to provide an input from the second polarity terminal 120 to the low side switch 235. The trace substrate 220 can couple with a source terminal of the low side switch 235 to provide an input from the second polarity terminal 115 to the low side switch 235. The trace substrate 220 can electrically couple at least one terminal (e.g., drain terminal, source terminal) of the high side switch 225 with at least one terminal of the low side switch 235 (e.g., drain terminal, source terminal). The trace substrate 220 can electrically couple the high side switch 225 and the low side switch 235 with at least one output terminal 125 of the power module 105.

The electrical pathway from the first polarity terminal 115 through the trace substrate 220 to the high side switch 225 to the high side connector 230 can form or correspond to the first current path 210 of the power loop 205. The output terminal 125 can couple with the first polarity terminal 115 through the first current path 210. The electrical pathway from the high side connector 230 through the low side switch 235 through the low side connector 240 to the second polarity terminal 120 can form or correspond to the second current path 215 of the power loop 205. The output terminal 125 can couple with the second polarity terminal 115 through the second current path 215. The output terminals 125 can include two output terminals 125 corresponding to a common mode node of the power module 105 circuit. For example, a first output terminal 125 can couple with the first polarity terminal 115 and the second polarity terminal 120 through the first current path 210 and the second current path 215. A second output terminal 125 can couple with the first polarity terminal 115 and the second polarity terminal 120 through the first current path 210 and the second current path 215. The first current path 210 can overlap with the second current path 215 within the power module 105 to form a power loop 205 that reduces parasitic inductance through mutual inductance. For example, the first polarity terminal 115 can be vertically aligned, positioned parallel with respect to each other or have a sandwiched positional relationship with the second polarity terminal 120. The first current path 210 can be vertically aligned or have a sandwiched positional relationship with the second current path 215.

The high side switch 225 and low side switch 235 can couple through sintered connections to the trace substrate 220. For example, high side switch 225 and low side switch 235 can be sintered to a base plate or to the trace substrate 220 to couple the high side switch 225 and low side switch 235 within the power module 105. The trace substrate 220 can electrically couple the first polarity terminal 115 with the high side switch 225. The trace substrate 220 can electrically couple the second polarity terminal 120 with the low side switch 235. The high side switch 225 and low side switch 235 can be electrically coupled to other components (e.g., first polarity terminal 115, second polarity terminal 120, trace substrate 220, output terminals 125) using silver (Ag) sinter as a die attachment and a copper (Cu) connection (e.g., flip clip, connectors 230, 240) as an electrical interconnection. The power loop 205 can be formed to targeting parasitic inductance. For example, the sandwich structure design or sandwich relationship between the first current path 210 and the second current path 215 can provide inductance cancellation. By replacing the individual current path segments of the first current path 210 and the second current path 215 into opposite current pairs and forming the power loop 205, the magnetic coupling in the third dimension reduces or cancels out the self-inductance impact of the first current path 210 and the second current path 215.

Figure 3:
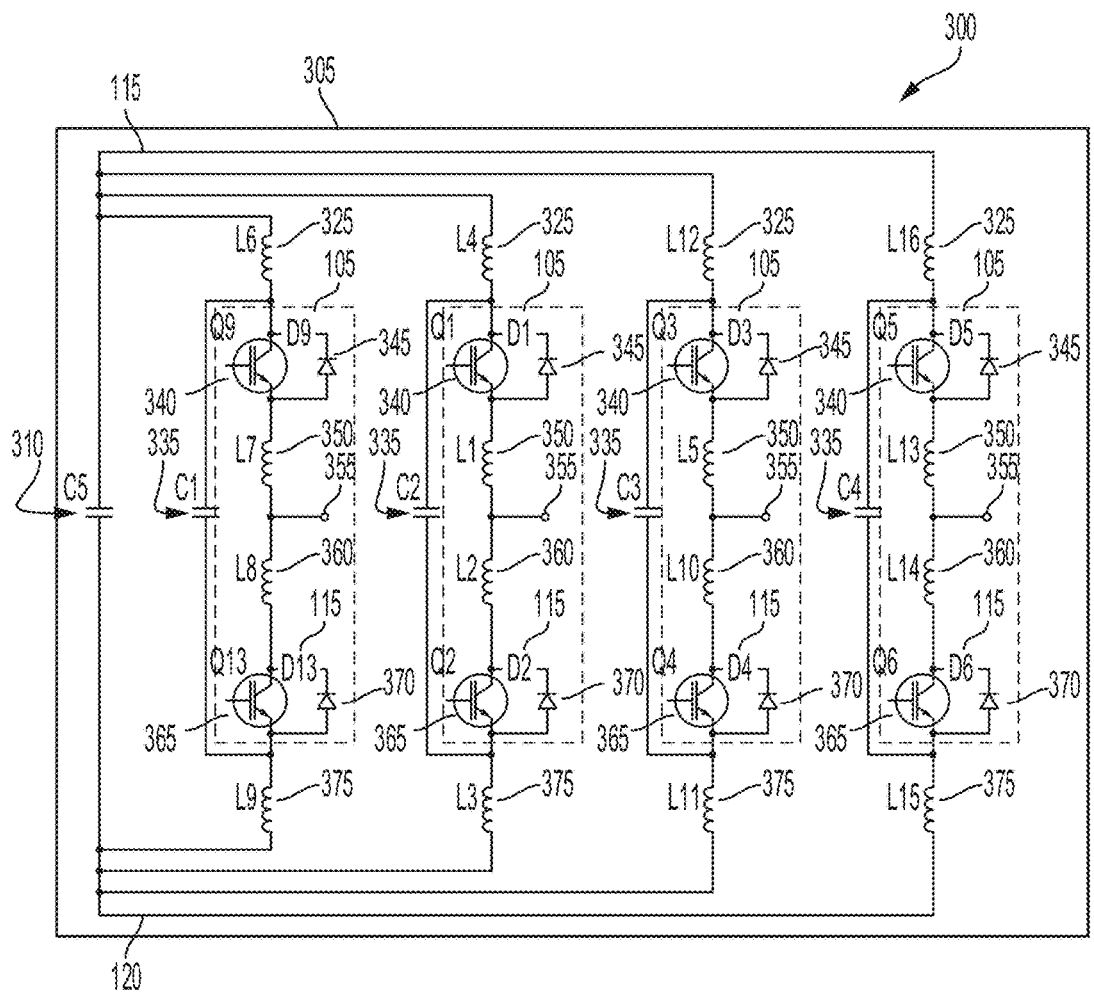
FIG. 3 is a circuit schematic of a parallel power module arrangement for an inverter module for a drivetrain of an electric vehicle, according to an illustrative implementation.

FIG. 3, among others, depicts a circuit schematic 300 of four power modules 105 coupled in parallel with each other and with a DC capacitor 310 (e.g., DC link capacitor). The circuit schematic 300 can correspond to a circuit for an inverter module 305 of a drivetrain of an electric vehicle. The circuit schematic 300 can include the three terminals of each of the four modules 105 coupled at or extending from a common end or side of the inverter module 305. For example, each of the four power modules can include a first polarity terminal 115, a second polarity terminal 120, and an output terminal 125 positioned or located on the same side or located at the same end of the inverter module 305. Thus, the inverter module 305 can be formed having a smaller footprint and more compact size as compared to other inverter modules of vehicles. Further, having the terminals 115, 120, 125 located on the same side or located at the same end of the inverter module 305 can provide a more accessible and straightforward to couple the inverter module 305 within a drivetrain of an electric vehicle. For example, each of the terminals 115, 120, 125 can be aligned with respect to each other along the common side or edge of the inverter module 305 to couple with busbars, for example a three layered busbar, of a drivetrain of an electric vehicle. Each of the terminals 115, 120, 125 can couple from the common side or edge such that the compartment of the drivetrain housing the inverter module 305 does not need to be to sized to allow for connecting with terminals 115, 120, 125 located at different sides or edges of the inverter module 305, thus increasing the size of the drivetrain and difficulty of extending wires or wirebonds from busbars to the different terminals 115, 120, 125 located at different sides or edges of the inverter module 305. The inverter modules 305 as described herein can include the first polarity terminals 115 of each of the power modules 105 forming the inverter module 305 coupled with a first polarity busbar of the drivetrain of the electric vehicle from a first side or first edge of the inverter module 305. The second polarity terminals 120 of each of the power modules 105 forming the inverter module 305 can couple with a second polarity busbar of the drivetrain of the electric vehicle from the first side or the first edge of the inverter module 305. The output terminals 125 of each of the power modules 105 forming the inverter module 305 can couple with a phase output busbar of the drivetrain of the electric vehicle from the first side or the first edge of the inverter module 305. The four power modules 105 can be positioned within a distance from each other and the DC capacitor 310 to reduce an inductance value of each of the power loops 205 of each of the power modules 105. For example, the four power modules 105 can be positioned having a separation or distance from each other in a range from 0.5 mm to 3.5 mm (e.g., 2 mm). The separation or distance between the power modules 105 can vary within or outside this range. For example, the distance the power modules 105 are spaced from each other and the DC capacitor 310 can be selected to reduce, cancel or filter out the DC terminal inductances of the power modules 105. The distance the power modules 105 are spaced from each other and the DC capacitor 310 can be selected based in part on thermal coupling considerations.

The power modules 105 can couple in parallel to form a single phase portion of an inverter module 305 for a drive train of an electric vehicle. For example, a single phase portion of an inverter module 305 can include multiple power modules 105, here four power modules 105. Thus, the circuit schematic 300 can correspond to a circuit schematic of one phase of a three phase inverter module 305 for a drive train of an electric vehicle. The power modules 105 can couple in parallel with the DC capacitor 310 such that each power module 105 has first and second polarity terminals 115, 120 coupled with the DC capacitor 310. For example, first polarity terminals 115 of each of the power modules 105 can couple with a first terminal of the DC capacitor 310 and second polarity terminals 120 of each of the power modules 105 can couple with a second terminal of the DC capacitor 310. The first polarity terminals 115 can correspond to positive polarity terminals for the power modules 105. The second polarity terminals 120 can correspond to negative polarity terminals for the power modules 105.

Each of the power modules 105 can form or include a sandwich phase leg power module that in combination for a single phase of an inverter module 305 of a drivetrain of an electric vehicle. Each of the power modules 105 can be formed having similar components to provide for ease of replacement or repair. For example, each of the power modules 105 can include a first polarity terminal 115 (e.g., positive terminal) and a second polarity terminal 120 (e.g., negative terminal). The power modules 105 can include an inductor 325 having a first terminal coupled with the first polarity terminal 115. The inductor 325 can have a second terminal coupled with a capacitor 335, a switching element 340, and a diode 345. For example, the second terminal of the inductor 325 can couple with a first terminal of the capacitor 335, a first terminal (e.g., collector terminal) of a switching element 340, and a first terminal of a diode 345. The switching element 340 can couple in parallel with the diode 345. For example, the first terminal (e.g., collector terminal) of the switching element 340 can couple with the first terminal (e.g., cathode terminal) of the diode 345. A second terminal (e.g., gate terminal) of the switching element 340 can couple with a gate driver or printed circuit board to receive an electrical signal to control operation of the switching element 340. A third terminal of the switching element 340 (e.g., emitter terminal) can couple with a second terminal (e.g., anode terminal) of the diode 345. The switching element 340 and the diode 345 can form a high side switch of the power module 105. For example, the switching element 340 and the diode 345 can be coupled between the first polarity terminal 115 and the output terminal 355 or common mode terminal of the power module 105. The third terminal of the switching element 340 (e.g., emitter terminal) and the second terminal (e.g., anode terminal) of the diode 345 can couple with a first terminal of an inductor 350. A second terminal of the inductor 350 can couple with an output terminal 355.

The output terminal 355 can correspond to a common mode terminal of the respective power module 105. A first terminal of an inductor 360 can couple with the output terminal 355. A second terminal of the inductor 360 can couple with a first terminal (e.g., collector terminal) of a switching element 365 and a first terminal of a diode 370. The switching element 365 can couple in parallel with the diode 370. For example, the first terminal (e.g., collector terminal) of the switching element 365 can couple with the first terminal (e.g., cathode terminal) of the diode 370. A second terminal (e.g., gate terminal) of the switching element 365 can couple with a gate driver or printed circuit board to receive an electrical signal to control operation of the switching element 365. A third terminal of the switching element 365 (e.g., emitter terminal) can couple with a second terminal (e.g., anode terminal) of the diode 370. The switching element 365 and the diode 370 can form a low side switch of the power module 105. For example, the switching element 365 and the diode 370 can be coupled between the output terminal 355 or common mode terminal of the power module 105 and the second polarity terminal 120. The third terminal of the switching element 365 (e.g., emitter terminal) and the second terminal (e.g., anode terminal) of the diode 370 can couple with a second terminal of a capacitor 335. The second terminal of the capacitor 335, the third terminal of the switching element 365 (e.g., emitter terminal), and the second terminal (e.g., anode terminal) of the diode 370 can couple with a first terminal of an inductor 375. A second terminal of the inductor 375 can couple with the second polarity terminal 120. The switching elements 340, 365 as described herein can include, but not limited to, a transistor, an insulated gate bipolar transistor (IGBT), or a MOSFET.

Figure 4:
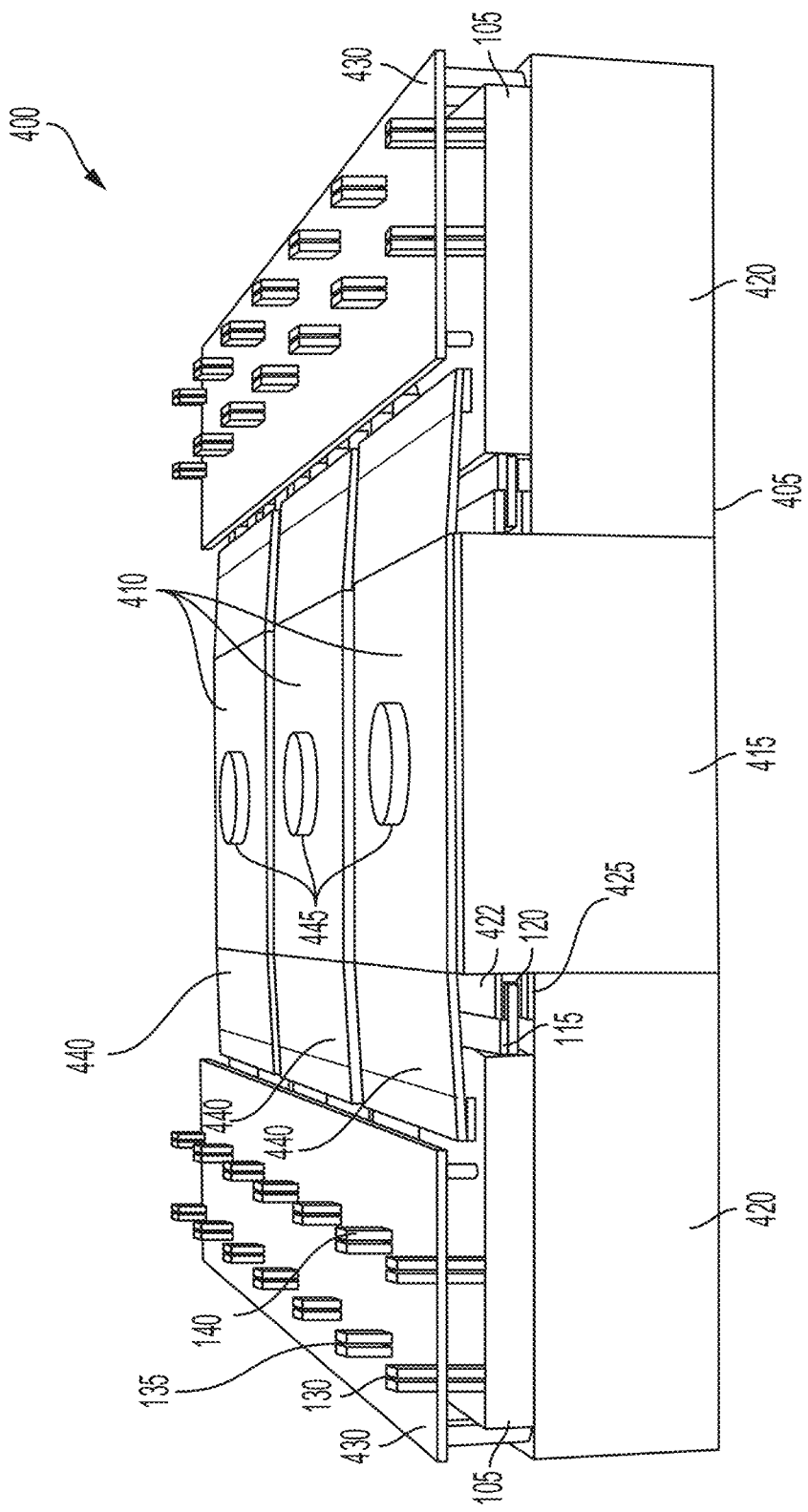
FIG. 4 is a diagram depicting an inverter module for a drivetrain of an electric vehicle, according to an illustrative implementation.

FIG. 4, among others, depicts a side view 400 of an inverter module 405. The inverter module 405 can include three individual phase portions 410 to form a three phase inverter module 405 for a drivetrain of an electric vehicle. The phase portions 410 can generate a single phase voltage for the inverter module 405. The phase portions 410 (or single phase portions) can be formed having multiple power modules 105. For example, the phase portions 410 can be formed having four power modules 105. Thus, the circuit schematic 300 of FIG. 3 can correspond to a circuit schematic of the phase portions 410 forming the inverter module 405. The inverter module 405 can include a first phase portion 410. The first phase portion 410 can include two power modules 105 of the first row of power modules 105 and two power modules 105 of the second row of power modules 105. The inverter module 405 can include a second phase portion 410. The second phase portion 410 can include two power modules 105 of the first row of power modules 105 and two power modules 105 of the second row of power modules 105. The inverter module 405 can include a third phase portion 410. The third phase portion 410 can include two power modules 105 of the first row of power modules 105 and two power modules 105 of the second row of power modules 105. The phase portions 410 can correspond to the single phase inverter module 305 of FIG. 3. For example, a first phase portion 410 can generate a first single phase voltage. The first phase portion 410 can include four power modules 105. A second phase portion 410 can generate a second single phase voltage. The second phase portion 410 can include four power modules 105. A third phase portion 410 can generate a third single phase voltage. The third phase portion 410 can include four power modules 105. Thus, the first, second, and third phase portions 410 can form a three phase inverter module 405. The first phase portion 410 can include a first two power modules 105 of the first row of power modules 105 and a first two power modules 105 of the second row of power modules 105. The second phase portion 410 can include a second two power modules 105 of the first row of power modules 105 and a second two power modules 105 of the second row of power modules 105. The third phase portion 410 can include a third two power modules 105 of the first row of power modules 105 and a third two power modules 105 of the second row of power modules 105.

The inverter module 405 can include at least one film capacitor 415. The film capacitor 415 can be disposed in middle portion or middle region of the inverter module 405. For example, the film capacitor 415 can be disposed such that it is positioned between the power modules 105 forming each of the phase portions 410 and the inverter module 405. The film capacitor 415 can include, but not limited to, a plastic film capacitor, a film dielectric capacitor, or a polymer film capacitor. The inverter module 405 can include at least one heat sink 420. The inverter module 405 can include a heat sink 420 disposed on opposing or opposite sides of the film capacitor 415. The power modules 105 can be disposed over, on or otherwise in contact with at least one surface of a heat sink 420. For example, the power modules 105 can be disposed over, on or in contact with a top surface of the heat sinks 420. The power modules 105 can include at least one surface (e.g., bottom surface) in direct contact with at least one surface (e.g., top surface) of the heat sinks 420. The power modules 105 can include at least one surface (e.g., bottom surface) in indirect contact with at least one surface (e.g., top surface) of the heat sinks 420. For example, an adhesive material or adhesive layer can be disposed between the at least one surface (e.g., bottom surface) of the power modules 105 and the at least one surface (e.g., top surface) of the heat sinks 420 to couple the power modules 105 with the heat sinks 420. The heat sinks 420 can provide active cooling or passive cooling to the electronics of the power modules 105 and thus, to the power modules 105. The heat sinks 420 can include or be formed as cold plates positioned proximate to the power modules 105. The heat sinks 420 may include a plurality of cooling passages in which coolant can by pumped or otherwise provided through. The heat sinks 420 can include non-conductive material. For example, the heat sinks 420 can include, but not limited to, aluminum or an aluminum composite material.

The film capacitor 415 can include a first terminal 422 and a second terminal 425. The first polarity terminal 115 of each of the power modules 105 can couple with the first terminal 422 of the film capacitor. For example, the first polarity terminal 115 of each of the power modules 105 can be welded (e.g., laser welded) with the first terminal 422 of the film capacitor. The second polarity terminal 120 of each of the power modules 105 can couple with the second terminal 425 of the film capacitor. For example, the second polarity terminal 120 of each of the power modules 105 can be welded (e.g., laser welded) with the second terminal 425 of the film capacitor. Each of power modules 105 can couple with the film capacitor 415 in a parallel relationship. For example, the power modules 105 can couple in parallel with the film capacitor 415 such that each power module 105 has first and second polarity terminals 115, 120 coupled with the film capacitor 415. The first polarity terminals 115 of each of the power modules 105 can couple with the first terminal 422 of the film capacitor 415 and second polarity terminals 120 of each of the power modules 105 can couple with the second terminal 425 of the film capacitor 415. The first polarity terminals 115 can correspond to positive polarity terminals for the power modules 105. The second polarity terminals 120 can correspond to negative polarity terminals for the power modules 105. The first polarity terminals 115 of the power modules 105 of the first row of power modules 105 can be aligned in a common plane and parallel with respect to each other to couple with the first terminal 422 disposed on the first side of the capacitor 415. The first polarity terminals 115 of the power modules 105 of the second row of power modules can be aligned in a common plane and parallel with respect to each other to couple with the first terminal 422 disposed on the second side of the capacitor 415. The second polarity terminals 120 of the power modules 105 of the first row of power modules 105 can be aligned in a common plane and parallel with respect to each other to couple with the second terminal 425 disposed on the first side of the capacitor 415. The second polarity terminals 120 of the power modules 105 of the second row of power modules can be aligned in a common plane and parallel with respect to each other to couple with the second terminal 425 disposed on the second side of the capacitor 415.

The inverter module 405 can include at least one gate driver circuit 430. The inverter module 405 can include a first gate driver circuit 430 disposed over a first row of power modules 105 and a second gate driver circuit 430 disposed over a second row of power modules 105. For example, the first gate driver circuit 430 can be disposed over, on or in contact with a top surface the power modules 105 forming the first row of power modules 105. The first gate driver circuit 430 can include at least one surface (e.g., bottom surface) in direct contact with at least one surface (e.g., top surface) of the power modules 105 forming the first row of power modules 105. The first gate driver circuit 430 can include at least one surface (e.g., bottom surface) in indirect contact with at least one surface (e.g., top surface) of the power modules 105 forming the first row of power modules 105. For example, an adhesive material or adhesive layer can be disposed between the at least one surface (e.g., bottom surface) of the first gate driver circuit 430 and the at least one surface (e.g., top surface) of the power modules 105 forming the first row of power modules 105. The second gate driver circuit 430 can be disposed over, on or in contact with a top surface the power modules 105 forming the second row of power modules 105. The second gate driver circuit 430 can include at least one surface (e.g., bottom surface) in direct contact with at least one surface (e.g., top surface) of the power modules 105 forming the second row of power modules 105. The second gate driver circuit 430 can include at least one surface (e.g., bottom surface) in indirect contact with at least one surface (e.g., top surface) of the power modules 105 forming the second row of power modules 105. For example, an adhesive material or adhesive layer can be disposed between the at least one surface (e.g., bottom surface) of the second gate driver circuit 430 and the at least one surface (e.g., top surface) of the power modules 105 forming the second row of power modules 105. The first gate driver circuit 430 can couple with terminals (e.g., terminals 130, 135) from the first row of power modules 105. The second gate driver circuit 430 can couple with terminals (e.g., terminals 130,135) from the second row of power modules 105. The gate driver circuit 430 can include a printed circuit board. The gate driver circuits 430 can include control circuitry to communicate with or receive data from the power modules 105. The gate driver circuits 430 can include control circuitry to generate and provide power signals to the power modules 105. The gate driver circuits 430 can include control circuitry to generate and provide control signals to the power modules 105. For example, the gate driver circuits 430 can include control circuitry to generate and provide control signals to switching elements (e.g., high side switches 225, low side switches 235) within the power modules 105. The control signals can activate (e.g., turn-on) or de-activate (e.g., turn-off) the respective switching elements (e.g., high side switches 225, low side switches 235) within the power modules 105. The gate driver circuits 430 can include a connection ports or orifices that terminals or leads of the power module 105 can couple with to couple the respective power module 105 with the respective gate driver circuit 430. Each of the power modules 105 can include a high gate terminal 135 and a low gate terminal 130 that couples with the gate driver circuit 430. Each of the power modules 105 may include a temperature terminal 140 that couples with the gate driver circuit 430. For example, a plurality of high gate terminals 135 can electrically couple the power modules 105 with at least one gate driver circuit 430 and a plurality of low gate terminals 130 can electrically couple the power modules with at least one gate driver circuit 430.

The high gate terminals 135 (or high gate leads) can extend from the power modules 105 to orifices formed through the gate driver circuit 430. The high gate terminal 135 can include a first end that couples with a high side switch of the power module 105 and a second end that couples with the gate driver circuit 430. For example, the high gate terminals 135 can provide signals to a gate terminal of the respective high gate switch of the power modules 105 from the gate driver circuit 430. The high gate terminals 135 can form an electrical pathway from the high side switch of the power modules 105 to the gate driver circuit 430. A first plurality of high gate terminals 135 of the first row of power modules 105 can couple with the first gate driver circuit 430 and a second plurality of high gate terminals 135 of the second row of power modules 105 can couple with the second gate driver circuit 430. For example, each of the power modules 105 in the first row of power modules can include at least one high gate terminal 135 to couple with the first gate driver circuit 430. Each of the power modules 105 in the second row of power modules 105 can include at least one high gate terminal 135 to couple with the second gate driver circuit 430.

The low gate terminals 130 (or low gate leads) can extend from the power modules 105 to orifices formed through the gate driver circuit 430. The low gate terminal 130 can include a first end that couples with a low side switch of the power module 105 and a second end that couples with the gate driver circuit 430. For example, the low gate terminals 130 can provide signals to a gate terminal of the respective low gate switch of the power modules 105 from the gate driver circuit 430. The low gate terminals 130 can form an electrical pathway from the low side switch of the power modules 105 to the gate driver circuit 430. A first plurality of low gate terminals 130 of the first row of power modules 105 can couple with the first gate driver circuit 430 and a second plurality of low gate terminals 130 of the second row of power modules 105 can couple with the second gate driver circuit 430. For example, each of the power modules 105 in the first row of power modules can include at least one low gate terminal 130 to couple with the first gate driver circuit 430. Each of the power modules 105 in the second row of power modules 105 can include at least one low gate terminal 130 to couple with the second gate driver circuit 430. The temperature terminals 140 can extend from the power modules 105 to orifices formed through the gate driver circuit 430. The temperature terminal 140 can include a first end that couples with at least one surface of an interior of the power module 105 or with a component of the power module 105 and a second end that couples with the gate driver circuit 430. For example, the temperature terminals 140 can provide temperature data from the power modules 105 to the gate driver circuit 430.

Figure 5:
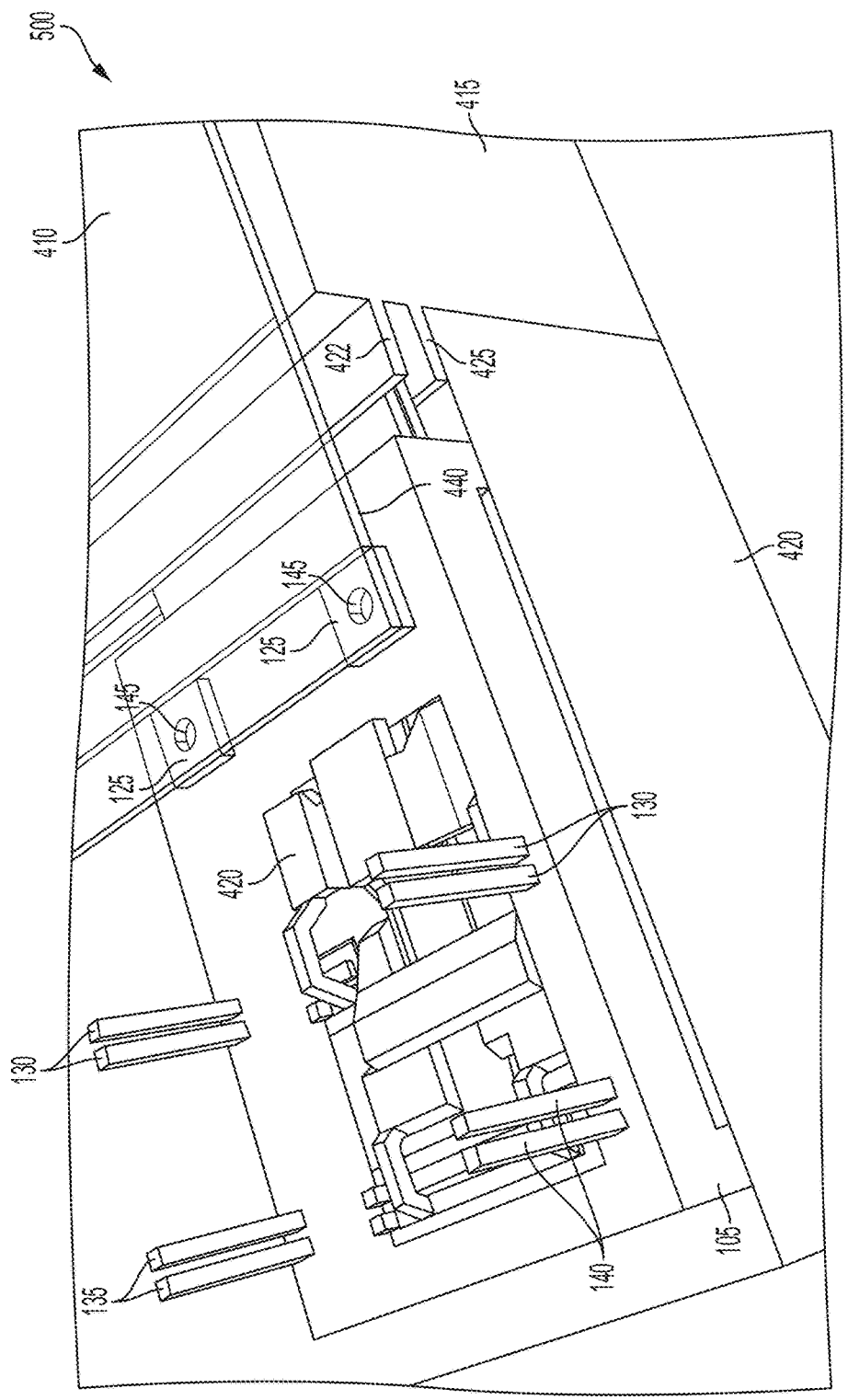
FIG. 5 is a depicting a cross-sectional view of a portion of an inverter module for a drivetrain of an electric vehicle, according to an illustrative implementation.

FIG. 5, among others, depicts a view 500 showing the phase output surfaces 440 coupled with the output terminals 125 of a power module 105. The phase portions 410 of the inverter module 405 can include phase output surfaces 440. The phase output surfaces 440 can electrically couple the output terminals 125 of the power modules 105 with phase output terminals 445 of the inverter module 405. The phase output surfaces 440 can contact or couple through a connector with the output terminals 125 of the power modules 105. For example, the phase output surfaces 440 can include an orifice or hole such that a bolt or connector can couple the output terminals 125 of the power modules 105 with the phase output surfaces 440. The output terminals 125 can include at least one orifice or hole to receive a bolt or connector to couple the respective output terminal 125 with the phase output surface 440 of the inverter module 405. The phase output surfaces 440 can include conductive material. For example, the phase output surface 440 can include, but not limited to, metal material, metallic material, or copper.

The inverter module 405 can include a first phase output surface 440, a second phase output surface 440, and a third phase output surface 440. The first phase output surface 440 can electrically couple first output terminals 125 of the power modules 105 of the first row of power modules 105 with a first phase output terminal 445. The first phase output surface 440 can electrically couple first output terminals 125 of the power modules 105 of the second first row of power modules 105 with the first phase output terminal 445. The second phase output surface 440 can electrically couple second output terminals 125 of the power modules 105 of the first row of power modules 105 with a second phase output terminal 445. The second phase output surface 440 can electrically couple second output terminals 125 of the power modules 105 of the second first row of power modules 105 with the second phase output terminal 445. The third phase output surface 440 can electrically couple third output terminals 125 of the power modules 105 of the first row of power modules 105 with a third phase output terminal 445. The third phase output surface 440 can electrically couple third output terminals 125 of the power modules 105 of the second first row of power modules 105 with the third phase output terminal 445. The first phase output surface 440 can electrically couple a first phase portion 410 with a first phase output terminal 445 of the inverter module 405. The second phase output surface 440 can electrically couple a second phase portion 410 with a second phase output terminal 445 of the inverter module 405. The third phase output surface 440 can electrically couple a third phase portion 410 with a third phase output terminal 445 of the inverter module 405.

Referring back to FIG. 4, each phase portion 410 can include at least one phase output surface 440. Thus, a three phase inverter module 405 can include three phase output surfaces 440. Each of the phase output surfaces 440 can correspond to a single phase of the inverter module 405. Each phase output surface 440 can couple with multiple power modules 105. For example, the phase output surfaces 440 can couple with a first pair of power modules 105 (e.g., two power modules 105) along a first edge surface of the phase output surfaces 440 and a second pair of power modules 105 (e.g., two power modules 105) along a second edge surface of the phase output surfaces 440. The first edge surface can correspond to an opposite or opposing edge surface with respect to the second edge surface of the phase output surfaces 440. The phase portions 410 of the inverter module 405 can include phase output terminals 445. The phase output terminals 445 can correspond to output terminals of each phase of the inverter module 405. The phase output terminals 445 can couple with a drivetrain system of an electric vehicle to provide power to the drivetrain system. For example, the phase output terminals 445 can provide power generated by the power modules 105 to a drivetrain system of an electric vehicle to provide power to the drivetrain system. The phase output terminals 445 can be formed on the same side, same surface or common surface of the inverter module 405. The phase output terminals 445 can be formed on the same surface or common side of the inverter module 405 to provide ease for a system level assembly. For example, the inverter module 405 can couple with other components of the drivetrain system from the phase output terminals 445 formed on the same side or surface of the inverter module 405. Thus, improving the assembly process by making it easier to couple wires to each phase output terminal 445 of the inverter module 405. The phase output terminals 445 can include conductive material. For example, the phase output terminals 445 can include, but not limited to, metal material, metallic material, or copper.

Figure 6:
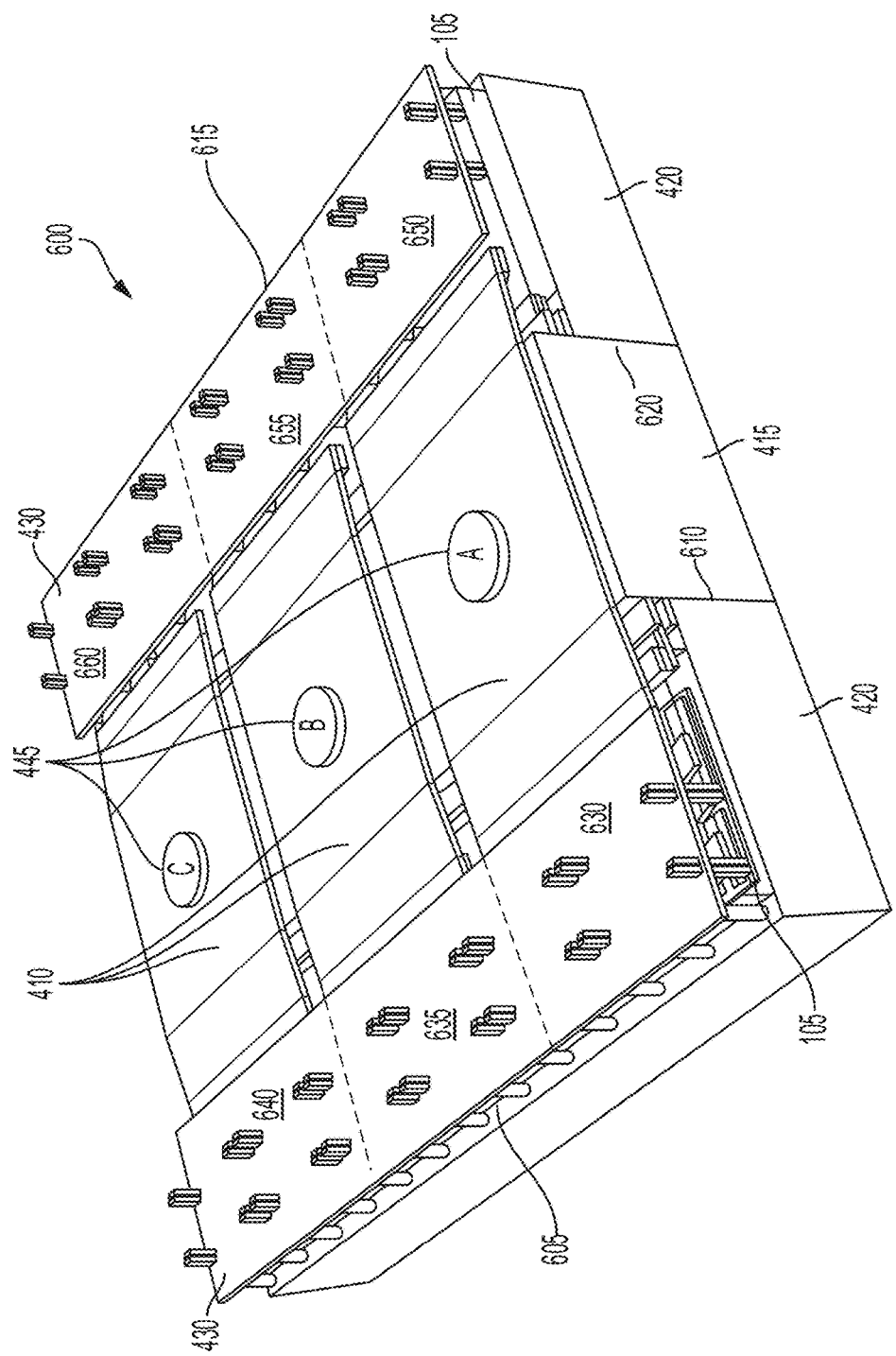
FIG. 6 is a diagram depicting an inverter module for a drivetrain of an electric vehicle, according to an illustrative implementation.

FIG. 6, among others, depicts a side view 600 of the inverter module 405. The inverter module 405 can be formed having a variety of different dimensions based at least in part on dimensions of a drivetrain system. The inverter module 405 can have a smaller footprint to couple with a drive train system of an electric vehicle. For example, the inverter module 405 can be formed have a square shape or rectangular shape to accommodate a motor cross-section of an electric vehicle. The inverter module 405 can have a width in a range from 140 mm to 180 mm (e.g., 160 mm). The width of the inverter module 405 can vary within or outside this range. The inverter module 405 can have a length in a range from 150 mm to 190 mm (e.g., 173 mm). The length of the inverter module 405 can vary within or outside this range. The alignment of the power modules 105 within the inverter module 405 can provide the smaller footprint of the inverter module 405. The power modules 105 forming the inverter module 405 can be aligned (e.g., lined up) with each other within the inverter module 405 and coupled with the film capacitor 415 forming two queues, two rows, or otherwise positioned within an orderly fashion along two sides of the film capacitor 415.

For example, a first row 605 of power modules 105 can be positioned along a first side 610 of the inverter module 405 and second row 615 of power modules 105 can be positioned along a second side 620 of the inverter module 405. The first side 610 of the inverter module 405 can be an opposite or opposing side as compared to the second side 615 of the inverter module 405. The power modules 105 arranged in rows 605, 615 can provide a smaller footprint and thus a smaller inverter module 405. The rows 605, 615 can include pairs of power modules 105. For example, the first row 605 can include a first pair 630 of power modules 105, a second pair 635 of power modules 105, and a third pair 640 of power modules 105. The second row 615 can include a first pair 650 of power modules 105, a second pair 655 of power modules 105, and a third pair 660 of power modules 105. The first pair 630 of power modules 105 can correspond to two power modules 105 out of four power modules forming the first phase portion 410 of the inverter module 405. For example, the first pair 630 of the first row 605 and couple with the first pair 650 of the second row 615 to form the first phase portion 410 of the inverter module 405. The second pair 635 of power modules 105 can correspond to two power modules 105 out of four power modules forming the second phase portion 410 of the inverter module 405. For example, the second pair 635 of the first row 605 and couple with the second pair 655 of the second row 615 to form the second phase portion 410 of the inverter module 405. The third pair 640 of power modules 105 can correspond to two power modules 105 out of four power modules forming the third phase portion 410 of the inverter module 405. For example, the third pair 640 of the first row 605 can couple with the third pair 660 of the second row 615 to form the third phase portion 410 of the inverter module 405. Thus, the inverter module 405 may include twelve power modules 105. For example, the first row 605 can include six power modules 105 and the second row 615 can include six power modules 105. A power module 105 (e.g., SiC device) can be rated at 100 A/1200V and each power module 105 can hold up to 150 A output at the leveled-up temperature. From the inverter module 405 point of view, current of each phase can be rated at 600 A. The power modules 105 can be formed having similar components to provide for ease of replacement, repair. Further, the inverter module 405 design can provide flexible current rating/power rating based on the motor peak power requirement. Thus, for different desired power levels, the number of parallel power modules 105 can be increased or reduced and maintain the same system-level design concept or inverter module design. The alignment of the power module 105 can position each of the power modules 105 such that the power modules 105 are positioned the same or a similar distance from the film capacitor 415 to reduce the footprint of the inverter module 405. The positioning of the power modules 105 can reduce and balance the parasitic inductance outside of the power modules 105 and the inverter module 405.

Figure 7:
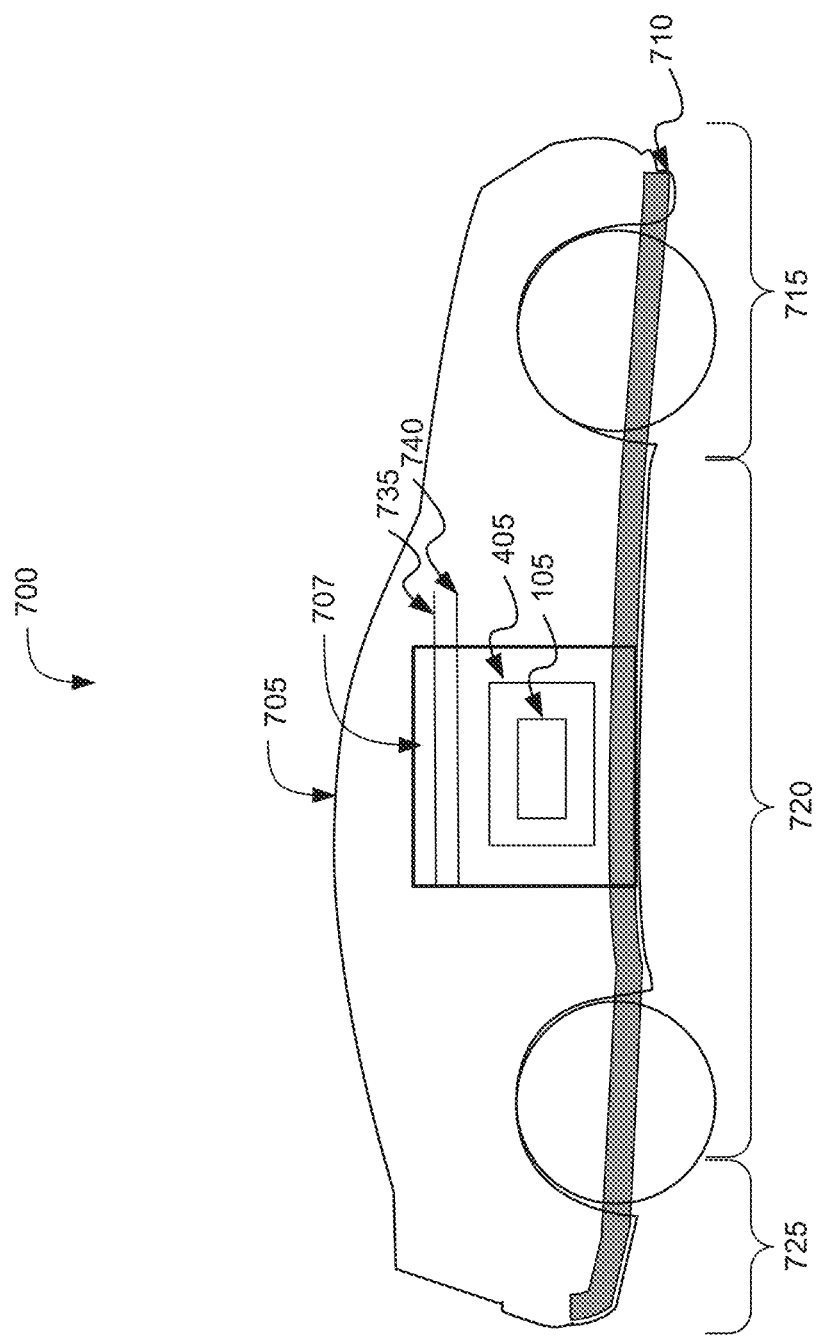
FIG. 7 is a block diagram depicting a cross-sectional view of an example electric vehicle installed with a battery pack, according to an illustrative implementation.

FIG. 7 depicts a cross-section view 700 of an electric vehicle 705 installed with a power module 105 and an inverter module 405. For example, the inverter module 405 can include multiple power modules 105 to form a three phase inverter module 405. The inverter module 405 and power module 105 can be disposed in a drivetrain 707 of the electric vehicle 705. The inverter modules 405 and power modules 105 described herein can be used to power drivetrains 707 residing in electric vehicles 705 for an automotive configuration. For example, the inverter modules 405 and power modules 105 can be disposed in the drivetrain 707 and the drivetrain 707 can be disposed in the electric vehicle 705. An automotive configuration includes a configuration, arrangement or network of electrical, electronic, mechanical or electromechanical devices within a vehicle of any type. An automotive configuration can include inverter modules 405 and power modules 105 for drivetrains 707 in vehicles such as electric vehicles (EVs). EVs can include electric automobiles, cars, motorcycles, scooters, passenger vehicles, passenger or commercial trucks, and other vehicles such as sea or air transport vehicles, planes, helicopters, submarines, boats, or drones. EVs can be fully autonomous, partially autonomous, or unmanned. Thus, the electric vehicle 705 can include an autonomous, semi-autonomous, or non-autonomous human operated vehicle. The electric vehicle 705 can include a hybrid vehicle that operates from on-board electric sources and from gasoline or other power sources. The electric vehicle 705 can include automobiles, cars, trucks, passenger vehicles, industrial vehicles, motorcycles, and other transport vehicles. The electric vehicle 705 can include a chassis 710 (e.g., a frame, internal frame, or support structure). The chassis 710 can support various components of the electric vehicle 705. The chassis 710 can span a front portion 715 (e.g., a hood or bonnet portion), a body portion 720, and a rear portion 725 (e.g., a trunk portion) of the electric vehicle 705. The front portion 715 can include the portion of the electric vehicle 705 from the front bumper to the front wheel well of the electric vehicle 705. The body portion 720 can include the portion of the electric vehicle 705 from the front wheel well to the back wheel well of the electric vehicle 705. The rear portion 725 can include the portion of the electric vehicle 705 from the back wheel well to the back bumper of the electric vehicle 705.

The drivetrain 707 that includes the inverter module 405 having at least one power module 105 can be installed or placed within the electric vehicle 705. The drivetrain 707 may include components of the electric vehicle 705 that generate or provide power to drive the wheels or move the electric vehicle 705. The drivetrain 707 can include a power train of the electric vehicle 705. The drivetrain 707 can include at least one of or a combination of the components of the electric vehicle 705 between an engine and the driving wheels including the clutch, axle and driveline. For example, the drivetrain 707 can include a transmission, a differential component, a gearbox, front and rear final drive component, drive shafts, a clutch component and a propeller shaft. The drivetrain 707 can be a component of an electric vehicle drive system. The electric vehicle drive system can transmit or provide power to different components of the electric vehicle 705. For example, the electric vehicle drivetrain system 707 can transmit power from the inverter module 405 to an axle or wheels of the electric vehicle 705. The drivetrain 707 can be installed on the chassis 710 of the electric vehicle 705 within the front portion 715, the body portion 720 (as depicted in FIG. 7), or the rear portion 725. A first busbar 735 (e.g., first polarity busbar) and a second busbar 740 (e.g., second polarity busbar) can be connected or otherwise be electrically coupled with other electrical components of the electric vehicle 705 to provide electrical power from the drivetrain 707 to the other electrical components of the electric vehicle 705. For example, the first busbar 735 can couple with at least one surface of the inverter module 405 of the drivetrain 707 through a wirebond or bonding element. The second busbar 740 can couple with at least one surface of the inverter module 405 of the drivetrain 707 through a wirebond or bonding element.

Figure 8:
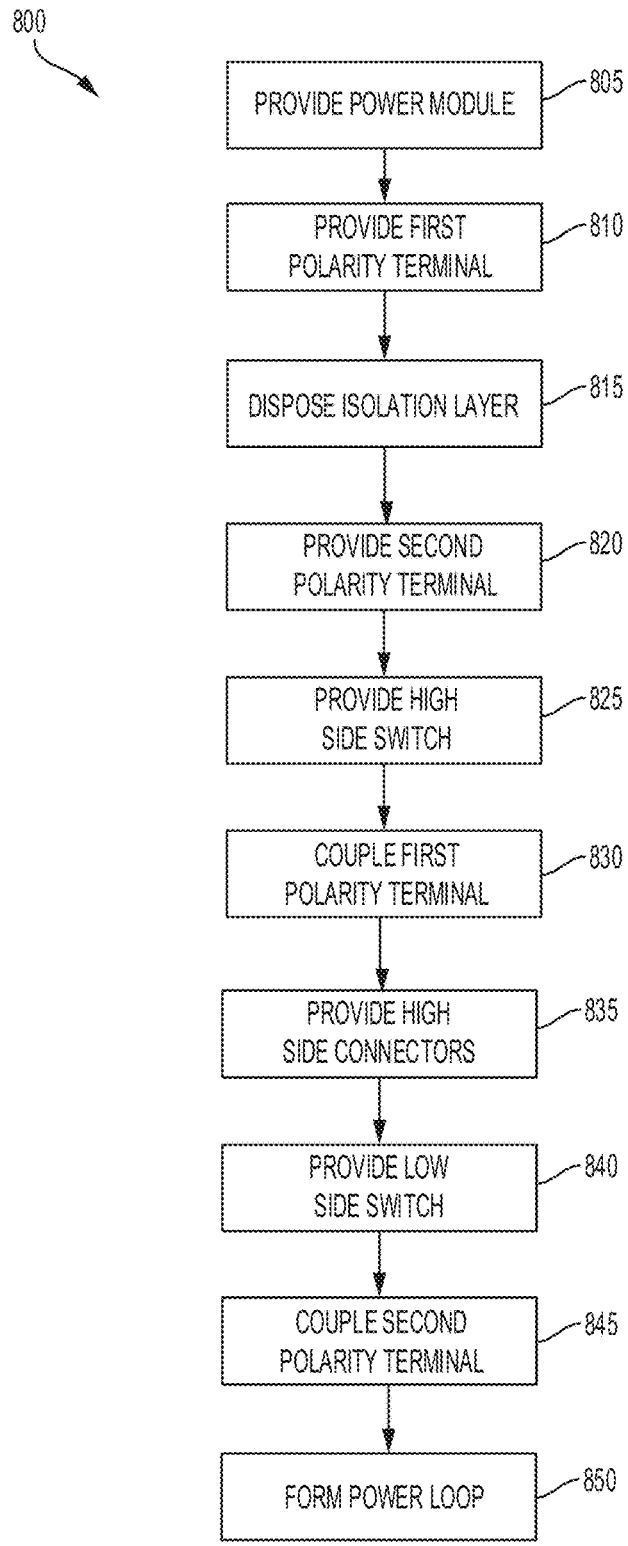
FIG. 8 is a flow diagram depicting an example method of providing a power module for a drivetrain of an electric vehicle.

FIG. 8, among others, depicts a method 800 for providing a power module 105 for a drivetrain 707 of an electric vehicle 705. The method 800 can include providing a power module (ACT 805). For example, a power module 105 can be provided or formed having a 2-in-1 phase leg module design. A housing 110 can be formed for the power module 105 to hold, house, or otherwise contain the components of the power module 105. The housing 110 can be formed using a transfer molding technique. For example, a material (e.g., non-conductive material) can be preheated and loaded into a container or cavity for molding. The shape and dimensions of the molding can be selected to correspond to the shape and dimensions of the power module 105. The housing 110 can be formed such that it surrounds an outer surface of the power module 105. The housing 110 can be formed such that it surrounds an outer surface of the power module 105 and includes an open area to allow access to the terminals (e.g., output terminals 125, gate terminals 130, 135) of the power module 105. The housing 110 can be formed using a transfer molding technique. For example, a lead frame can be formed around an outer surface of the power module 105 to server as the housing 110 for the power module 105. The lead frame housing 110 can be formed such that it surrounds an outer surface of the power module 105 and includes an open area to allow access to the terminals (e.g., output terminals 125, gate terminals 130, 135) of the power module 105. The power module 105 can provide an integrated solution having interconnection leads packaged within the respective power module 105, for example, within the housing 110 of the power module 105. The power module 105 can be formed as or include a sandwich phase-leg silicon carbide (SiC) power module.

The method 800 can include providing a first polarity terminal 115 (ACT 810). The first polarity terminal 115 can be formed extending from at least one end (e.g., first end, second end) of the power module 105. For example, the first polarity terminal 115 can extend out of a first end of the housing 110 to be exposed for coupling to other electrical components of a drivetrains 707 of an electric vehicle 705. The first polarity terminal 115 can include a first surface and a second surface. The first and second surfaces of the first polarity terminal 115 can be formed having a flat or planar surfaces. Providing the first polarity terminal 115 can include forming the first polarity terminal 115 from conductive material, such as but not limited to, metal material, metallic material, or copper. The first polarity terminal 115 can correspond to a positive terminal for the power module 105. The first polarity terminal 115 can correspond to a negative terminal for the power module 105.

The method 800 can include disposing an isolation layer 122 (ACT 815). For example, an isolation layer 122 can be disposed over at least one surface of the first polarity terminal 115. The isolation layer 122 can have a first surface and a second surface, and the first surface of the isolation layer 122 can be disposed over, positioned in contact with or coupled with the second surface of the first polarity terminal 115. The first surface of the isolation layer 122 can be in direct contact with the second surface of the first polarity terminal 115. The first surface of the isolation layer 122 can be in indirect contact with the second surface of the first polarity terminal 115. For example, an adhesive layer can be disposed between the first surface of the isolation layer 122 and the second surface of the first polarity terminal 115 to couple the isolation layer 122 with the first polarity terminal 115. Disposing the isolation layer 122 can include forming the isolation layer 122 from a non-conductive material, for example, a polymer material, insulation material, plastic material, glass material, ceramic material or epoxy material. The isolation layer 122 can be positioned within the power module 105 to electrically isolate or electrically insulate the first polarity terminal 115 from other conductive materials or connection points within the power module 105. For example, the isolation layer 122 can be positioned within the power module 105 to electrically isolate or electrically insulate the first polarity terminal 115 from a second polarity terminal 120.

The method 800 can include providing a second polarity terminal 120 (ACT 820). The second polarity terminal 120 can be formed extending from at least one end (e.g., first end, second end) of the power module 105. For example, the second polarity terminal 120 can extend out of a first end of the housing 110 to be exposed for coupling to other electrical components of a drivetrains 707 of an electric vehicle 705. The second polarity terminal 120 can include a first surface and a second surface. The first and second surfaces of the second polarity terminal 120 can be formed having a flat or planar surfaces. Providing the second polarity terminal 120 can include forming the second polarity terminal 120 from conductive material, such as but not limited to, metal material, metallic material, or copper. The second polarity terminal 120 can correspond to a negative terminal for the power module 105. The second polarity terminal 120 can correspond to a positive terminal for the power module 105. The second polarity terminal 120 can be an opposite polarity from the first polarity terminal 115.

Providing the second polarity terminal 120 can include disposing the first surface of the second polarity terminal 120 over, in contact with or coupled with the second surface of the isolation layer 122. For example, the isolation layer 122 can be positioned between the first polarity terminal 115 and the second polarity terminal 120 to electrically isolate the first polarity terminal 115 from the second polarity terminal 120. Providing the second polarity terminal 120 can include forming the second polarity terminal 120 to extend from the same end of the power module 105 and housing 110 as the first polarity terminal 115. For example, the first polarity terminal 115 and the second polarity terminal 120 can be positioned having a sandwich relationship with respect to each other such that the first polarity terminal 115 is positioned over or under the second polarity terminal 120. The first polarity terminal 115 can be positioned parallel and adjacent to the second polarity terminal 120. For example, the first polarity terminal 115 can be disposed over or in contact with the isolation layer 122. The isolation layer 122 can be disposed over or in contact with the second polarity terminal 120. Thus, the first polarity terminal 115, isolation layer 122, and the second polarity terminal 120 can be disposed having a vertical alignment with respect to each other. The vertical alignment of the first polarity terminal 115, isolation layer 122, and the second polarity terminal 120 can provide a smaller footprint within the power module 105 and thus, aid in reducing the overall dimensions or footprint of the power module 105 itself.

The method 800 can include providing a high side switch 225 (ACT 825). For example, the power module 105 can include at least one high side switch 225. The power module can include two or more high side switches 225. Providing the high side switch 225 can include disposing a switching element within the power module 105. The high side switch 225 can include a transistor, an insulated gate bipolar transistor (IGBT), or a MOSFET. The high side switch 225 can be positioned within the power module 105 to couple the first polarity terminal 115 with at least one output terminal 125 of the power module 105. For example, the high side switch 225 can couple between the first polarity terminal 115 and the output terminal 125 to control operation and output of the respective power module 105. The high side switch 225 can form or be disposed on one half of a portion or half of a leg of a circuit forming the power module 105. The high side switch 225 can control output of half a portion or half a leg of a circuit forming the power module 105. The high side switch 225 can be electrically coupled with a high side connector 230.

The method 800 can include coupling the first polarity terminal 115 (ACT 830). Coupling the first polarity terminal 115 can include forming a first current path 210 within the power module 105. The first polarity terminal 115 can couple with the first current path 210 though a trace substrate 220. The trace substrate 220 can include conductive material to electrically couple the first polarity terminal 115 with the first current path 210. Coupling the first polarity terminal 115 can include electrically coupling the first polarity terminal 115 with the high side switch 225 through the trace substrate 220. For example, the first polarity terminal 115 can provide a voltage to at least one terminal of the high side switch 225 through the trace substrate 220. The first polarity terminal 115 can provide a voltage to a drain terminal or a source terminal of the high side switch 225 through the trace substrate 220.

The method 800 can include providing a high side connector 230 (ACT 835). For example, at least one high side connector 230 can be disposed within the power module 105. The high side connector 230 can electrically couple the high side switch 225 with at least one output terminal 125 of the power module 105. The high side switch 225 can generate an output signal (e.g., output voltage) and transmit the output signal to the output terminal 125 through the high side connector 230. The high side connector 230 can form an end point for the first current path 210. The high side connector 230 can form a transition point between the first current path 210 and a second current path 215 of the power module 105. Thus, the first current path 210 can include the first polarity terminal 115, the trace substrate 220, and the high side switch 225, and the high side connector 230. Providing the high side connector 230 can include forming the high side connector 230 from a conductive material, such as a metallic material, metal material, or copper.

The method 800 can include providing a low side switch 235 (ACT 840). For example, the power module 105 can include at least one low side switch 235. The power module can include two or more low side switches 235. Providing the low side switch 235 can include disposing a switching element within the power module 105. The low side switch 235 can include a transistor, an insulated gate bipolar transistor (IGBT), or a MOSFET. The low side switch 235 can be positioned within the power module 105 to couple a second polarity terminal 120 with at least one output terminal 125 of the power module 105. For example, the high side switch 225 can couple between the first polarity terminal 115 and the output terminal 125 to control operation and output of the respective power module 105. The low side switch 235 can form or be disposed on one half of a portion or half of a leg of a circuit forming the power module 105 (e.g., second current path 215). The low side switch 235 can control output of half a portion or half a leg of a circuit forming the power module 105. The low side switch 235 can be electrically coupled with a low side connector 240. Providing a low side switch 235 can include coupling the high side connector 230 with the low side switch 235. For example, the high side switch 225 can electrically couple with an output terminal 125 and the low side switch 235. The high side connector 230 can electrically couple the high side switch 225 with the output terminal 125 and the low side switch 235.

The method 800 can include coupling the second polarity terminal 120 (ACT 845). Coupling the second polarity terminal 120 can include forming a second current path 215 within the power module 105. The second polarity terminal 120 can couple with the second current path 215 though a low side connector 240. The low side connector 240 can include conductive material to electrically couple the second polarity terminal 120 with the second current path 215. Coupling the second polarity terminal 120 can include electrically coupling the second polarity terminal 120 with the low side switch 235 through the low side connector 240. For example, the second polarity terminal 120 can provide a voltage to at least one terminal of the low side switch 235 through the low side connector 240. The second polarity terminal 120 can provide a voltage to a drain terminal or a source terminal of the low side switch 235 through the low side connector 240. The second current path 215 can include the second polarity terminal 120, the low side connector 240, and the low side switch 235.

The method 800 can include forming a power loop 205 (ACT 850). The power module 105 can include a power loop 205 that includes the first current path 210 and the second current path 215. For example, forming the power loop 205 can include coupling the first current path 210 with the second current path 215. The first current path 210 can couple with the second current path 215 through the high side connector 230. The high side connector 230 can form a transition point between the first current path 210 and the second current path 215. Forming the power loop 205 can include forming an overlapping current path having the first current path 210 disposed in parallel with respect to the second current path 215. For example, the first current path 210 can be disposed over or under the second current path 215 and parallel with respect to the second current path 215. The first current path 210 can be disposed over and spaced a distance or separated from the second current path 215. The first current path 210 can be disposed over and spaced a distance corresponding to a thickness of at least one component forming the power loop 205. For example, the first current path 210 can be disposed over and spaced a distance corresponding to a thickness of at least one of or a combination of the high side switch 225, the low side switch 235, the high side connector 230, and the low side connector 240. The first current path 210 can be disposed adjacent to, next to, or proximate to and parallel with respect to the second current path 215. The power loop 205 of the power module 105 can be formed to reduce a self-inductance of the first current path 210 and a self-inductance of the second current path 215 through a mutual inductance value of the overlapping current path. For example, the first current path 210 can be positioned over or under the second current path 215 such that the self-inductances of the current paths 210, 215 cancel each out or otherwise a total inductance value of the power loop 205 through mutual inductance.

Figure 9:
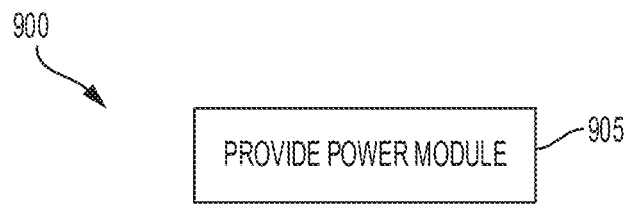
FIG. 9 is a flow diagram depicting an example method of providing a power module for a drivetrain of an electric vehicle.

FIG. 9 depicts a method 900. The method 900 can include providing a power module 105 for a drivetrain 707 of an electric vehicle 705 (ACT 905). The power module 105 can include a first polarity terminal 115 having a first surface and a second surface. The power module 105 can include an isolation layer 122 having a first surface and a second surface. The first surface of the isolation layer 122 can couple with the second surface of the first polarity terminal 115. The power module 105 can include a second polarity terminal 120 having a first surface and a second surface. The first surface of the second polarity terminal 120 can couple with the second surface of the isolation layer 122. The power module 105 can include a high side switch 225. The power module 105 can include a first current path 210 that electrically couples the first polarity terminal 115 with the high side switch 225. The power module 105 can include a low side switch 235. The power module 105 can include a second current path 215 that electrically couples the second polarity terminal 120 with the low side switch 235. The power module 105 can include a power loop 205 formed from the first current path 210 and the second current path 215. The power loop 205 can have an overlapping current path formed from the first current path 210 disposed in parallel with respect to the second current path 215. The power loop 205 can reduce a self-inductance of the first current path 210 and a self-inductance of the second current path 215 through a mutual inductance value of the overlapping current path.

Figure 10:
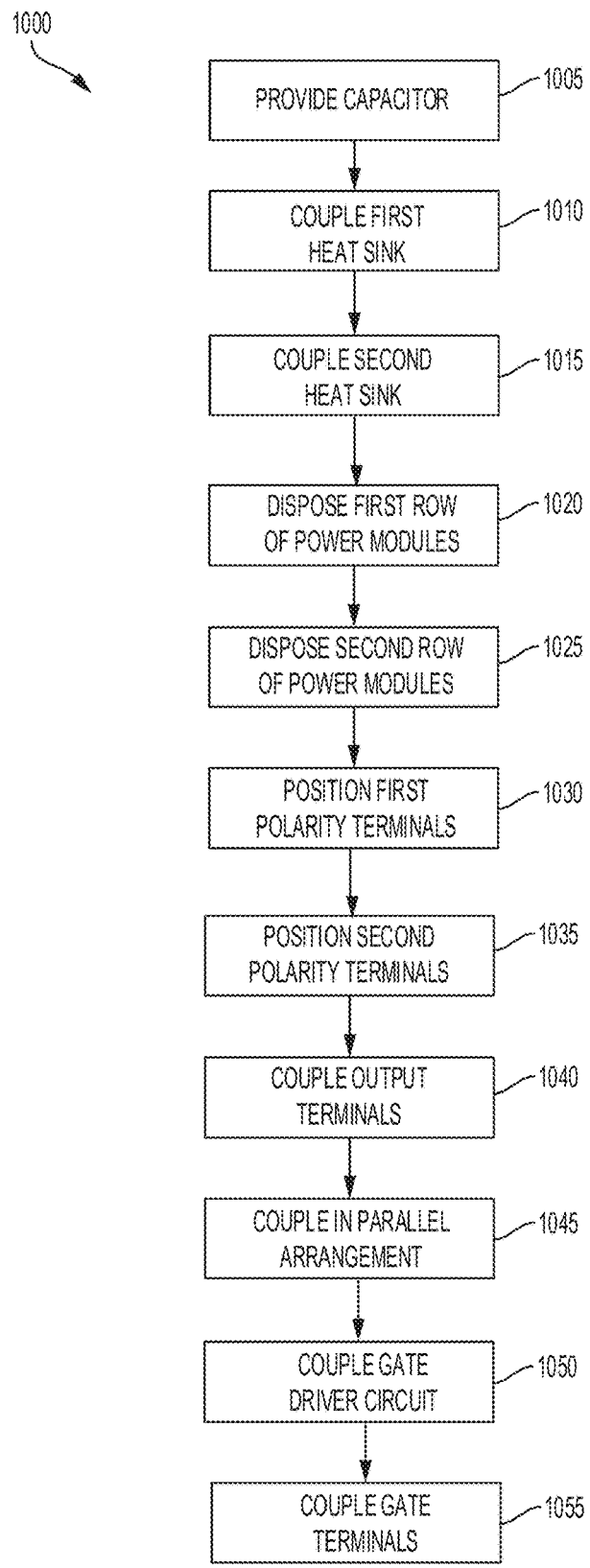
FIG. 10 is a flow diagram depicting an example method of providing an inverter module for a drivetrain of an electric vehicle.

FIG. 10, among others, depicts a method 1000 for providing an inverter module 405 for a drivetrain 707 of an electric vehicle 705. The method 1000 can include providing a capacitor 415 having a first side and a second side (ACT 1005). The inverter module 405 can be formed having at least one capacitor 415 (e.g., film capacitor). Providing the capacitor 415 can include disposing the capacitor 415 in a middle portion or middle region of the inverter module 405. Providing the capacitor 415 can include positioning the capacitor 415 between a plurality of power modules 105. For example, a first plurality of power modules 105 (e.g., phase portions 410) can couple with or be positioned adjacent to the first side of the capacitor 415. A second plurality of power modules 105 (e.g., phase portions 410) can couple with or be positioned adjacent to the second side of the capacitor 415. The capacitor 415 can be positioned at a central point of the inverter module 405 to couple with the plurality of power modules 105 forming the inverter module 405 in a compact design. For example, aligning the plurality of power modules 105 along both sides of the capacitor 415 can provide an inverter module 405 having a compact design and reduced footprint (e.g., smaller dimensions). Providing the capacitor 415 can include forming the capacitor 415 from at least one of: a plastic film capacitor, a film dielectric capacitor, or a polymer film capacitor.

The method 1000 can include coupling a first heat sink 420 with the first side of the capacitor 415 (ACT 1010). For example, a first heat sink 420 can couple with, be disposed on or positioned in contact with the first side of the capacitor 415. Coupling the first heat sink 420 can include positioning the first heat sink 420 adjacent to, next to or proximate to the first side of the capacitor 415. An adhesive material, adhesive layer or coupling agent can be disposed on a side of the first heat sink 420 to facilitate coupling the first heat sink 420 with the first side of the capacitor 415. Coupling the first heat sink 420 can include positioning the first heat sink 420 to provide active cooling or passive cooling to components (e.g., power modules 105) and electronics of the inverter module 405. The first heat sink 420 can be formed as a cold plate positioned proximate to the components of the inverter module 405. A plurality of cooling passages can be formed within the first heat sink 420 to provide a conduit for coolant to be provided to and pumped through for cooling the components of the inverter module 405 disposed next to the first heat sink 420. The first heat sink 420 can be formed from aluminum or an aluminum composite material.

The method 1000 can include coupling a second heat sink 420 with the second side of the capacitor 415 (ACT 1015). For example, a second heat sink 420 can couple with, be disposed on or positioned in contact with the second side of the capacitor 415. Coupling the second heat sink 420 can include positioning the second heat sink 420 adjacent to, next to or proximate to the second side of the capacitor 415. An adhesive material, adhesive layer or coupling agent can be disposed on a side of the second heat sink 420 to facilitate coupling the second heat sink 420 with the second side of the capacitor 415. Coupling the second heat sink 420 can include positioning the second heat sink 420 to provide active cooling or passive cooling to components (e.g., power modules 105) and electronics of the inverter module 405. The second heat sink 420 can be formed as a cold plate positioned proximate to the components of the inverter module 405. A plurality of cooling passages can be formed within the second heat sink 420 to provide a conduit for coolant to be provided to and pumped through for cooling the components of the inverter module 405 disposed next to the second heat sink 420. The second heat sink 420 can be formed from aluminum or an aluminum composite material.

The method 1000 can include disposing a first row of power modules 105 over the first heat sink 420 (ACT 1020). The first row of power modules 105 can couple with, be disposed on or in contact with the first side of the capacitor 415. For example, a first row of power modules 105 having two or more power modules 105 can couple with, be disposed on or in contact with a first surface (e.g., top surface) of the first heat sink 420. The first row of power modules 105 can be positioned along the first surface of the first heat sink 420 to couple with the first side of the capacitor 415. The first row of power modules 105 can include the power modules 105 organized or grouped into phase portions 410. For example, the inverter module 405 can include can include three individual phase portions 410 to form a three phase inverter module 405 for a drivetrain of an electric vehicle. The phase portions 410 can generate a single phase voltage for the inverter module 405. Disposing the first row of power modules 105 can include grouping two power modules 105 from the first row of power modules 105 into a first phase portion 410. Disposing the first row of power modules 105 can include grouping two power modules 105 from the first row of power modules 105 into a second phase portion 410. Disposing the first row of power modules 105 can include grouping two power modules 105 from the first row of power modules 105 into a third phase portion 410.

The method 1000 can include disposing a second row of power modules 105 over the second heat sink 420 (ACT 1025). The second row of power modules 105 can couple with, be disposed on, or in contact with the second side of the capacitor 415. For example, a second row of power modules 105 having two or more power modules 105 can couple with, be disposed on or in contact with a first surface (e.g., top surface) of the second heat sink 420. The second row of power modules 105 can be positioned along the first surface of the second heat sink 420 to couple with the second side of the capacitor 415. The second row of power modules 105 can include the power modules 105 organized or grouped into phase portions 410. Disposing the second row of power modules 105 can include grouping two power modules 105 from the second row of power modules 105 into the first phase portion 410. Thus, the first phase portion 410 can be formed having two power modules 105 from the first row of power modules 105 and two power modules 105 from the second row of power modules 105. Disposing the second row of power modules 105 can include grouping two power modules 105 from the second row of power modules 105 into the second phase portion 410. Thus, the second phase portion 410 can be formed having two power modules 105 from the first row of power modules 105 and two power modules 105 from the second row of power modules 105. Disposing the second row of power modules 105 can include grouping two power modules 105 from the second row of power modules 105 into the third phase portion 410. Thus, the third phase portion 410 can be formed having two power modules 105 from the first row of power modules 105 and two power modules 105 from the second row of power modules 105.

The method 1000 can include positioning at least one first polarity terminal 115 of each of the power modules 105 in contact with a first terminal 422 of the capacitor 415 (ACT 1030). Each of the power modules 105 can be poisoned along respective sides (e.g., first side, second side) of the capacitor 415 with first polarity terminals 115 positioned next to, facing, or proximate to at least one side of the capacitor 415. The capacitor can be formed having a first terminal 422 and a second terminal 425 along the first side of the capacitor 415 and a first terminal 422 and a second terminal 425 along the second side of the capacitor 415. Positioning the at least one first polarity terminal 115 can include coupling the first polarity terminals 115 of the power modules 105 with the first terminal 422 of the capacitor 415. Coupling the first polarity terminals 115 of the power modules 105 with the first terminal 422 can include welding (e.g., laser welding) the first polarity terminals 115 with the first terminal 422. The first polarity terminals 115 of the power modules 105 can couple with the first terminal 422 in a parallel relationship. For example, the first polarity terminals 115 of the first row of power modules 105 can be aligned with respect each other along the first side of the capacitor 415 and couple with the first terminal 422 of the capacitor 415 in a parallel relationship. The first polarity terminals 115 of the second row of power modules 105 can be aligned with respect each other along the second side of the capacitor 415 and couple with the first terminal 422 of the capacitor 415 in a parallel relationship. Thus, the first polarity terminals 115 of the power modules 105 can be aligned having a parallel relationship with respect to each other within the inverter module 405.

The method 1000 can include positioning at least one second polarity terminal 120 of each of the power modules 105 in contact with a second terminal 425 of the capacitor 415 (ACT 1035). The second polarity terminals 120 of the power modules 105 can be poisoned along the respective sides (e.g., first side, second side) of the capacitor 415. Positioning the at least one second polarity terminal 120 can include coupling the second polarity terminals 120 of the power modules 105 with the second terminal 425 of the capacitor 415. Coupling the second polarity terminals 120 of the power modules 105 with the second terminal 425 can include welding (e.g., laser welding) the second polarity terminals 120 with the second terminal 425. The second polarity terminals 120 of the power modules 105 can couple with the second terminal 425 in a parallel relationship. For example, the second polarity terminals 120 of the first row of power modules 105 can be aligned with respect each other along the first side of the capacitor 415 and couple with the second terminal 425 of the capacitor 415 in a parallel relationship. The second polarity terminals 120 of the second row of power modules 105 can be aligned with respect each other along the second side of the capacitor 415 and couple with the second terminal 425 of the capacitor 415 in a parallel relationship. Thus, the second polarity terminals 120 of the power modules 105 can be aligned having a parallel relationship with respect to each other within the inverter module 405.

The method 1000 can include coupling output terminals 125 of each of the power modules 105 with at least one phase output terminal 445 of the inverter module 405 (ACT 1040). For example, coupling the output terminals 125 can include positioning the output terminals 125 of the power modules 105 parallel with respect to each other along respective sides (e.g., first side, second side) of the capacitor 415. The output terminals 125 can be positioned to couple with or contact with at least one phase output surface 445 of the phase portions 410 of the inverter module 405. The phase output surfaces 440 can electrically couple the output terminals 125 of the power modules 105 with phase output terminals 445 of the invert module 405. Thus, the output terminals 125 of the first row of power modules 105 can be aligned with respect to each other and the output terminals 125 of the second row of power modules 105 can be aligned with respect to each other. Coupling output terminals 125 can include positioning the output terminals 125 at the same height with respect to a surface (e.g., top surface) of the power modules 105 such that the output terminals 125 are aligned. Coupling output terminals 125 can include disposing a connector through an orifice 145 of each of the output terminals 125. The connector can couple the respective output terminal 125 with at least one phase output surface 440. The phase output surfaces 440 can be formed having an orifice to receive the connector and couple with the output terminals 125.

The method 1000 can include coupling the power modules 105 in a parallel arrangement with the capacitor 415 (ACT 1045). For example, the first row of power modules 105 can be positioned along the first side of the capacitor 415 aligned with respect to each other. The first and second polarity terminals 115, 120 of each of the power modules 105 of the first row can couple with first and second terminals 422, 425 respectively of the capacitor 415 aligned with respect to each other. For example, the first polarity terminals 115 of each of the power modules 105 of the first row can be in aligned in a common plane or disposed at the same distance (e.g., height above) from first surface (e.g., top surface) of the first heat sink 420. The second polarity terminals 120 of each of the power modules 105 of the first row can be in aligned in a common plane or disposed at the same distance (e.g., height above) from first surface (e.g., top surface) of the first heat sink 420. Thus, the power modules 105 in the first row can be arranged parallel with respect to each other.

The second row of power modules 105 can be positioned along the second side of the capacitor 415 aligned with respect to each other. The first and second polarity terminals 115, 120 of each of the power modules 105 of the second row can couple with first and second terminals 422, 425 respectively of the capacitor 415 aligned with respect to each other. For example, the first polarity terminals 115 of each of the power modules 105 of the second row can be in aligned in a common plane or disposed at the same distance (e.g., height above) from first surface (e.g., top surface) of the first heat sink 420. The second polarity terminals 120 of each of the power modules 105 of the second row can be in aligned in a common plane or disposed at the same distance (e.g., height above) from first surface (e.g., top surface) of the first heat sink 420. Thus, the power modules 105 in the second row can be arranged parallel with respect to each other. The power modules 105 can be arranged or organized within the inverter module 405 to reduce a footprint of the inverter module 405 and reduce an inductance of the inverter module 405. For example, the width or length of the inverter module 405 can be reduced by half as the power modules 105 are arranged on both sides of the capacitor 415 instead of coupling with the same side of the capacitor 415. Thus, for different desired power levels, the number of parallel power modules 105 can be increased or reduced and maintain the same system-level design concept or inverter module design. The alignment of the power module 105 can position each of the power modules 105 such that the power modules 105 are positioned the same or a similar distance from the capacitor 415 to reduce the footprint of the inverter module 405. The positioning of the power modules 105 can reduce and balance the parasitic inductance outside of the power modules 105 and the inverter module 405. Further, the power modules 105 can be formed having the first and second polarity terminals 115, 120 aligned with respect to each other to create space to place phase output terminals 125 at the same side without increasing the footprint of the power module 105. For example, the inverter module 405 can include the power modules 150 positioned parallel and along the first side and second side of the capacitor 415 to reduce an inductance of the power modules 105 and the inverter module 405. The inverter module 405 having the power modules 150 arranged in a parallel arrangement can have a lower or reduced inductance as compared to other inverter modules having power modules disposed only along one side of a capacitor.

The method 1000 can include coupling a gate driver circuit 430 with the inverter module 405 (ACT 1050). Coupling the gate driver circuit 430 can include coupling a first gate driver circuit 430 with the first row of power modules 105 and coupling a second gate driver circuit 430 with the second row of power modules 105. The gate driver circuit 430 can be formed from a printed circuit board and include control circuitry to communicate with or receive data from the power modules 105. The first gate driver circuit 430 can be positioned over the first row of power modules 105 and the first heat sink 420. The second gate driver circuit 430 can be positioned over or disposed above the second row of power modules 105 and the second heat sink 420. The gate driver circuits 430 can be formed having control circuitry to generate and provide power signals to the power modules 105. The gate driver circuits 430 can be formed having control circuitry to generate and provide control signals to the power modules 105. For example, the gate driver circuits 430 can include control circuitry to generate and provide control signals to switching elements within the power modules 105. The control signals can activate (e.g., turn-on) or de-activate (e.g., turn-off) the respective switching elements within the power modules 105. Coupling the gate driver circuit 430 can include coupling leads or terminals of the power modules 105 with connection ports or orifices formed in or through the that gate driver circuits 430.

The method 1000 can include coupling gate terminals 130, 135 with the gate driver circuit 430 (ACT 1055). For example, coupling the gate terminals can include coupling at least one high gate terminal 135 from each of the power modules 105 with a gate driver circuit 430. Coupling the gate terminals can include coupling at least one low gate terminal 130 from each of the power modules 105 with a gate driver circuit 430. The high gate terminals 135 (or high gate leads) can extend from the power modules 105 to orifices formed through the gate driver circuit 430. Coupling the gate terminals can include coupling a first end of the high gate terminals 135 with at least one high side switch 225 of each of the power modules 105 and coupling a second end of the high gate terminals 135 with a gate driver circuit 430. The high gate terminals 135 can form an electrical pathway from the high side switches 225 of the power modules 105 to the gate driver circuit 430. For example, the high gate terminals 135 can provide signals (e.g., control signals, power signals) to a gate terminal of the respective high gate switch 225 of the power modules 105 from the gate driver circuit 430. The low gate terminals 130 (or low gate leads) can extend from the power modules 105 to orifices formed through the gate driver circuit 430. Coupling the gate terminals can include coupling a first end of the low gate terminals 130 with at least one low side switch 235 of each of the power modules 105 and coupling a second end of the low gate terminals 130 with a gate driver circuit 430. The low gate terminals 130 can form an electrical pathway from the low side switches 235 of the power modules 105 to the gate driver circuit 430. For example, the low gate terminals 130 can provide signals (e.g., control signals, power signals) to a gate terminal of the respective low gate switch 235 of the power modules 105 from the gate driver circuit 430.

Figure 11:
FIG. 11 is a flow diagram depicting an example method of providing an inverter module for a drivetrain of an electric vehicle.

FIG. 11 depicts a method 1100. The method 1100 can include providing an inverter module 405 for a drivetrain 707 of an electric vehicle 705 (ACT 1105). The inverter module 405 can include a capacitor 415 having a first side and a second side. The inverter module 405 can include a first heat sink 420 coupled with the first side of the capacitor 415. The inverter module 405 can include a second heat sink 420 coupled with the second side of the capacitor 415. The inverter module 405 can include a first row of power modules 105 coupled with the first side of the capacitor 415. The first row of power modules 105 can be disposed over the first heat sink 420. The inverter module 405 can include a second row of power modules 105 coupled with the second side of the capacitor 415. The second row of power modules 105 can be disposed over the second heat sink 420. Each of the power modules 105 can have at least one first polarity terminal 115 coupled with a first terminal 422 of the capacitor 415. Each of the power modules 105 can have at least one second polarity terminal 120 coupled with a second terminal 425 of the capacitor 415. Each of the power modules 105 can have output terminals 125 coupled with at least one phase output terminal 445 of the inverter module 405. The power modules 105 can couple in a parallel arrangement with the capacitor 415. The parallel arrangement can reduce an inductance of the power modules 105 and the inverter module 405. For example, the inverter module 405 can include the power modules 150 positioned parallel and along the first side and second side of the capacitor 415 to reduce an inductance of the power modules 105 and the inverter module 405. The inverter module 405 having the power modules 150 arranged in a parallel arrangement can have a lower or reduced inductance as compared to other inverter modules having power modules disposed only along one side of a capacitor.

Figure 12:
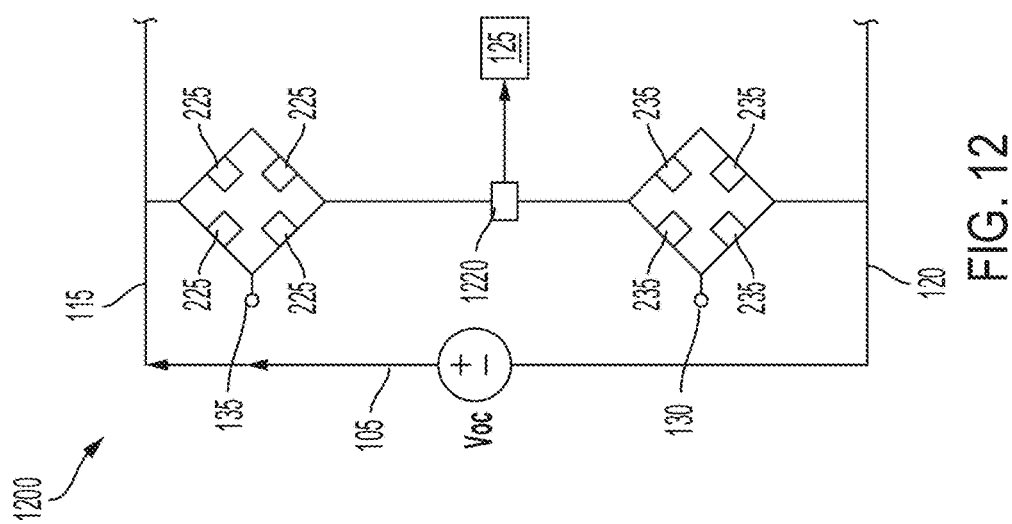
FIG. 12 diagram depicting a circuit schematic of a power module having a high side switch with four paralleled switching elements and a low side switch with four paralleled switching elements, according to an illustrative implementation.

FIG. 12, among others, depicts a circuit schematic 1200 of a power module 105 having a high side switch 225 with four paralleled switching elements 225 and a low side switch 235 with four paralleled switching elements 235. For example, the high side switches 225 as described herein can represent or include four high side switches or four switching elements. The four high side switches 225 can be positioned at the high side switch position of circuit diagram 1300 representing an example circuit for the power module 105. The four high side switches 225 can be electrically coupled in a parallel arrangement with respect to each other. For example, each of the four high side switches 225 can couple with a first polarity terminal 115. Each of the four high side switches 225 can couple with a common node 1220. The common node 1220 can correspond to a connection point between the high side switches 225, the low side switches 235 and the output terminal 125 of a power module 105. Thus, each of the four high side switches 225 can couple with one or more low side switches 235 (e.g., four low side switches 235) and the output terminal 125 though the common node 1220. A high gate terminal 135 can couple with a gate terminal of four paralleled high side switches 225. For example, the high gate terminal 135 can couple with a gate terminal of a first high side switch 225, a gate terminal of a second high side switch 225, a gate terminal of a third high side switch 225, and a gate terminal of a fourth high side switch 225. The power module 105 can include two high gate terminals 135. For example, a first high gate terminal 135 can couple with a gate terminal of a first high side switch 225 and a gate terminal of a second high side switch 225 and a second high gate terminal 135 can couple with a gate terminal of a third high side switch 225 and a gate terminal of a fourth high side switch 225.

The low side switches 235 as described herein can represent or include four low side switches or four switching elements. The four low side switches 235 can be positioned at the low side switch position of circuit diagram 1200 representing an example circuit for the power module 105. The four low side switches 235 can be electrically coupled in a parallel arrangement with respect to each other. For example, each of the four low side switches 235 can couple with a second polarity terminal 120. Each of the four low side switches 235 can couple with a common node 1220. For example, each of the four low side switches 235 can couple with one or more high side switches 225 (e.g., four high side switches 225) and the output terminal 125 though the common node 1220. A low gate terminal 130 can couple with a gate terminal of four paralleled low side switches 235. For example, the low gate terminal 130 can couple with a gate terminal of a first low side switch 235, a gate terminal of a second low side switch 235, a gate terminal of a third low side switch 235, and a gate terminal of a fourth low side switch 235. The power module 105 can include two low gate terminals 130. For example, a first low gate terminal 130 can couple with a gate terminal of a first low side switch 235 and a gate terminal of a second low side switch 235 and a second low gate terminal 130 can couple with a gate terminal of a third low side switch 235 and a gate terminal of a fourth low side switch 235.

Figure 13:
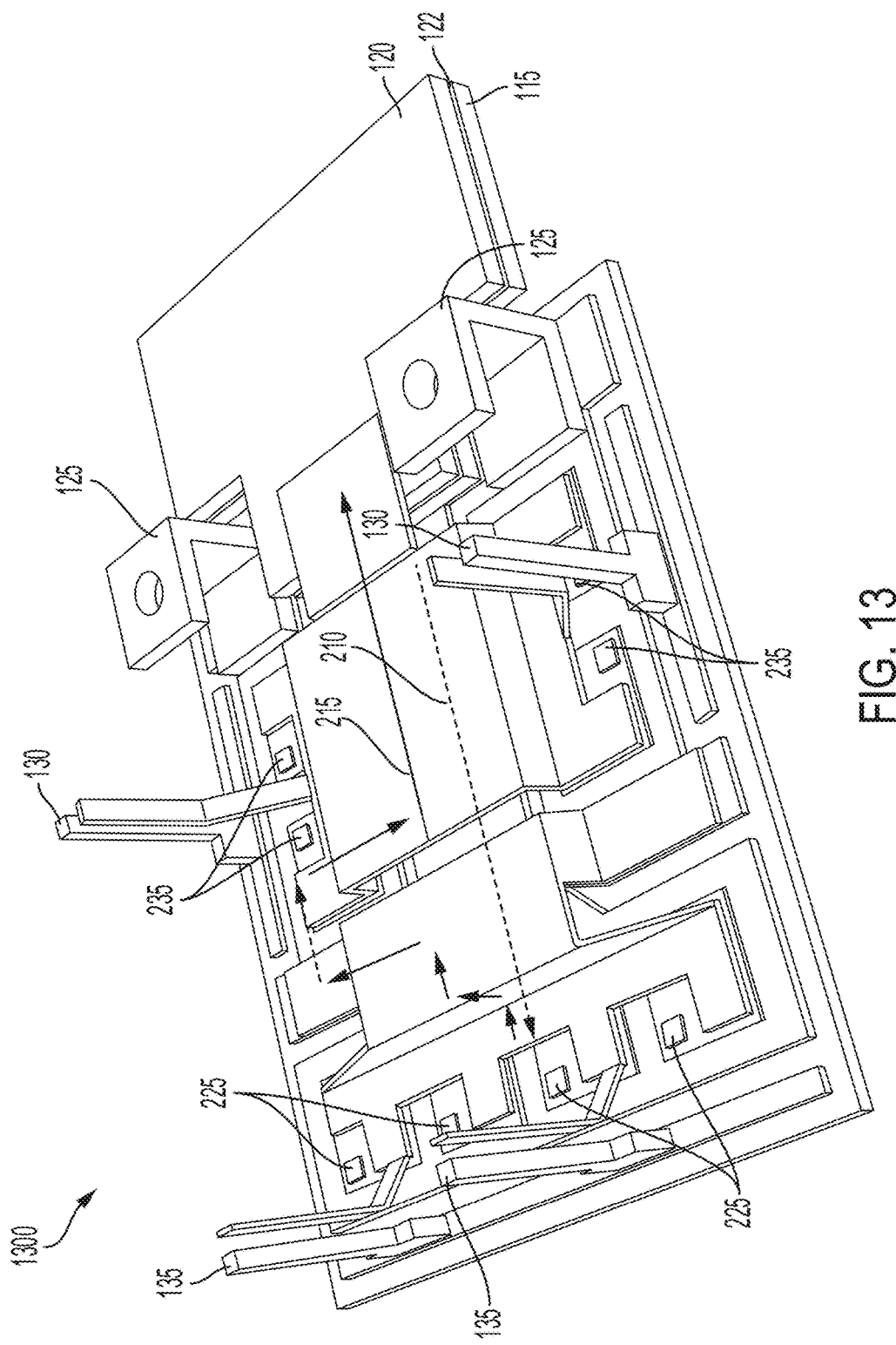
FIG. 13 is a diagram depicting a cross-sectional view of a power module having four high side switches and four low side switches, according to an illustrative implementation.
Figure 14:
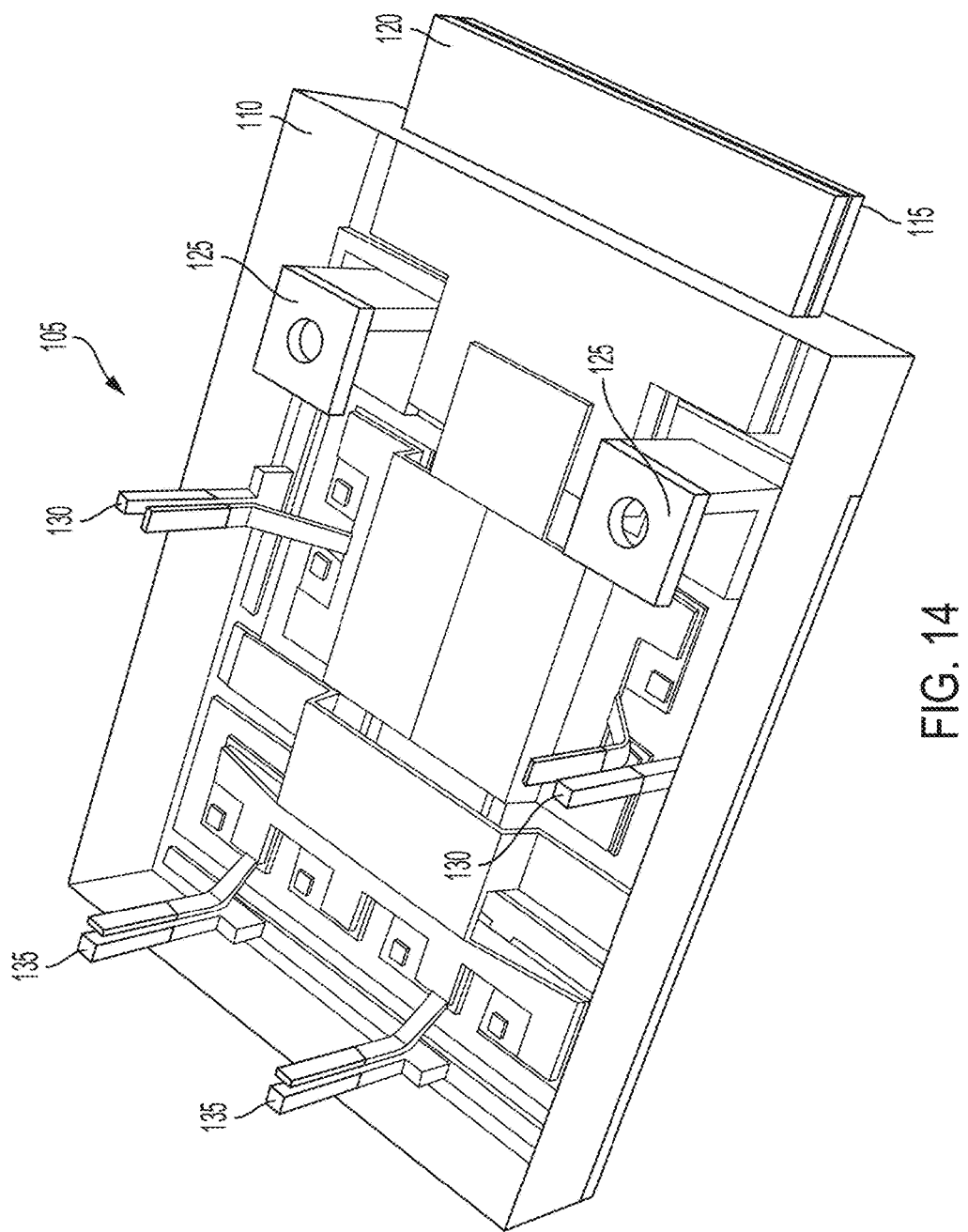
FIG. 14 diagram depicting a cross-sectional view of a power module having a molded housing, according to an illustrative implementation.

FIG. 13, among others, depicts a power module having four high side switches 225 (e.g., switching elements) and four low side switches 235 (e.g., switching elements). For example, the high side switch 225 can include a first switching element 225, a second switching element 225, a third switching element 225, and a fourth switching element 225. A first high gate terminal 135 can couple with the first switching element 225 and the second switching element 225. A second high gate terminal can couple with the third switching element 225 and the fourth switching element 225. The four switching elements 225 of the high side switch 225 can couple in a parallel arrangement with respect to each other. The low side switch 235 can include a first switching element 235, a second switching element 235, a third switching element 235, and a fourth switching element 235. A first low gate terminal 130 can couple with the first switching element 235 and the second switching element 235. A second low gate terminal 130 can couple with the third switching element 235 and the fourth switching element 235. The four switching elements 235 of the low side switch 235 can couple in a parallel arrangement with respect to each other. The four switching elements 225 of the high side switch 225 can be grouped into pairs for coupling with high gate terminals 135 and the four switching elements of the low side switch 235 can be grouped into pairs for coupling with low gate terminals 130. For example, the power module 105 can be formed having a first two low side switches 235 coupled with a first low gate terminal 130 and a first two high side switches 225 coupled with a first high gate terminal 135. The power module 105 can include a first two low side switches 235 coupled with a first low gate terminal 130 and a first two high side switches 225 coupled with a first high gate terminal 135. Thus, each switch position, high side switch position and low side switch position, can be controlled by a pair of gate terminals. The first low gate terminal 130 can couple with gate terminals of the first two low side switches 235 to provide control signals to the first two low side switches 235. The second low gate terminal 130 can couple with gate terminals of the second two low side switches 235 to provide control signals to the second two low side switches 235. The first high gate terminal 135 can couple with gate terminals of the first two high side switches 225 to provide control signals to the first two high side switches 225. The second high gate terminal 135 can couple with gate terminals of the second two high side switches 225 to provide control signals to the second two high side switches 225. FIG. 14 depicts the high side switch 225 having four high side switches 225 and the low side switch 235 having four low side switches 235. The power module 105 can be formed having more or less than four high side switches 225 and four low side switches 235. For example, the hide side switch 225 can include one high side switch 225. The high side switch 225 can include one two high side switches 225 coupled in parallel with respect to each other. The low side switch 235 can include one low side switch 235. The low side switch 235 can include one two low side switches 235 coupled in parallel with respect to each other.

FIG. 14, among others, depicts a power module 105 having a housing 110 formed through transfer molding techniques. For example, the housing 110 can include or be formed from a transfer molded package. The transfer molded package can be formed around one or more outer surfaces of the power module 105. For example, the housing 110 having the transfer molded package can be formed such that it surrounds an outer surface of the power module 105. The transfer molded package can be formed such that it surrounds an outer surface of the power module 105 and includes one or more open areas or one or more orifices for terminals of the power module 105 to extend through the housing 110. For example, a first polarity terminal 115 and a second polarity terminal 120 can extend from at least one side of the housing 110 to provide exposed portions of each of the first polarity terminal 115 and the second polarity terminal 120 for coupling with other components (e.g., capacitor terminals) of an inverter module 405. The first polarity terminal 115 and the second polarity terminal 120 can be disposed and extend from at least one end (e.g., first end) of the power module 105. The first polarity terminal 115 can be disposed adjacent with respect to the second polarity terminal 120. The first polarity terminal 115 can be disposed parallel with respect to the second polarity terminal 120. The first polarity terminal 115 and the second polarity terminal 120 can extend from the same or common side, first side, of the housing 110 to couple with other components (e.g., capacitor terminals) of an inverter module 405. Output terminals 125 can extend through at least one surface of the housing 110 to provide exposed portions of the output terminals 125 for coupling with other components (e.g., phase output surfaces) of an inverter module 405. Low gate terminals 130 and high gate terminals 135 can extend through at least one surface of the housing 110 to provide exposed portions of the output terminals 125 for coupling with other components (e.g., gate driver circuits) of an inverter module 405. The output terminals 125, the low gate terminals 130, and the high gate terminals 135 can extend through or from the same surface or same side of the housing 110. The transfer molded package housing 110 can house the interconnections of the power module 105. For example, the high side switches 225 and low side switches 235 can couple with a trace substrate 220, high side connectors 230, and low side connectors 240 within the transfer molded housing 110. Thus, the power module 105 can provide an integrated solution having interconnection leads packaged within the respective power module 105.

Figure 15:
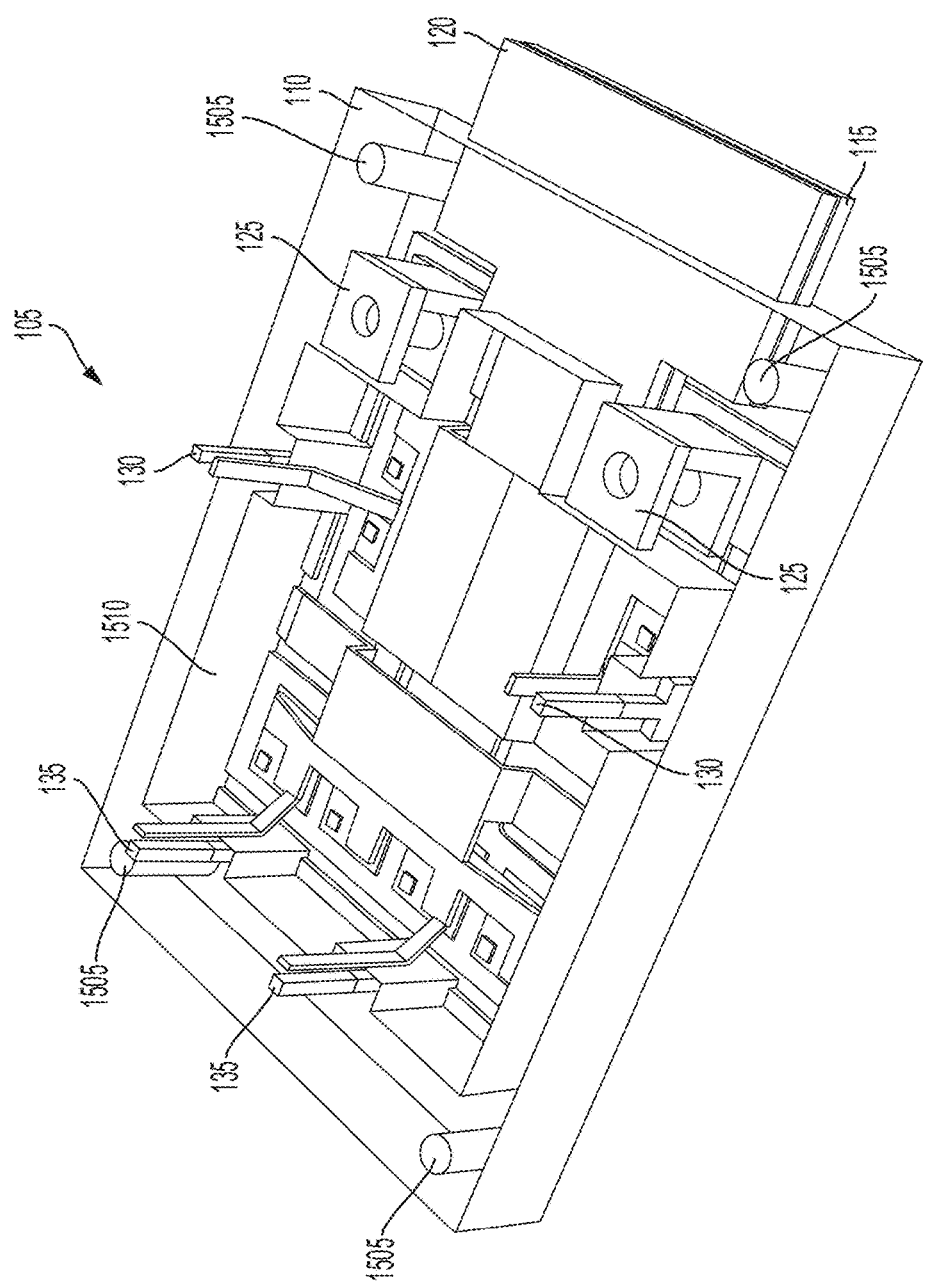
FIG. 15 is a diagram depicting a cross-sectional view of a power module having a lead frame housing, according to an illustrative implementation.

FIG. 15, among others, depicts a power module 105 having a housing 110 formed from a lead frame. For example, the housing 110 can include a lead frame design. The lead frame can provide a surface to electrically connect or physically connect the different components of the power module with each other. For example, the lead frame housing 110 can include a plurality of connection ports 1505 (e.g., four connection ports) to couple with or receive connectors, fasteners or other forms of coupling devices from other components of an inverter module 405. The housing 110 can be manufactured using a lead frame and silicone gel. The housing 110 having the lead frame can include non-conductive material, polymer material (e.g., thermoset polymer), resin material, epoxy resins, or aluminum material. The housing 110 having the lead frame can be formed around an outer surface of the power module 105. The lead frame housing 110 can be formed such that it surrounds an outer surface of the power module 105 and includes an open area 1510 to allow access to the terminals (e.g., output terminals 125, gate terminals 130, 135) of the power module 105. For example, the open area 1510 can expose high side switches 225 and low side switches 235. The lead frame housing 110 can include orifices for the different terminals of the power module 105 to extend through. For example, a first polarity terminal 115 and a second polarity terminal 120 can extend from at least one side of the lead frame housing 110 to provide exposed portions of each of the first polarity terminal 115 and the second polarity terminal 120 for coupling with other components (e.g., capacitor terminals) of an inverter module 405. The first polarity terminal 115 and the second polarity terminal 120 can be disposed and extend from at least one end (e.g., first end) of the power module 105. The first polarity terminal 115 can be disposed adjacent with respect to the second polarity terminal 120. The first polarity terminal 115 can be disposed parallel with respect to the second polarity terminal 120. The first polarity terminal 115 and the second polarity terminal 120 can extend from the same or common side, first side, of the lead frame housing 110 to couple with other components (e.g., capacitor terminals) of an inverter module 405. Output terminals 125 can extend through orifices formed in at least one surface of the lead frame housing 110 to provide exposed portions of the output terminals 125 for coupling with other components (e.g., phase output surfaces) of an inverter module 405. Low gate terminals 130 and high gate terminals 135 can extend through orifices formed in at least one surface of the lead frame housing 110 to provide exposed portions of the output terminals 125 for coupling with other components (e.g., gate driver circuits) of an inverter module 405. The output terminals 125, the low gate terminals 130, and the high gate terminals 135 can extend through or from the same surface or same side of the lead frame housing 110. The lead frame housing 110 can house the interconnections of the power module 105. For example, the high side switches 225 and low side switches 235 can couple with a trace substrate 220, high side connectors 230, and low side connectors 240 within portions of the lead frame housing 110. Thus, the power module 105 can provide an integrated solution having interconnection leads packaged within the respective power module 105.

While acts or operations may be depicted in the drawings or described in a particular order, such operations are not required to be performed in the particular order shown or described, or in sequential order, and all depicted or described operations are not required to be performed. Actions described herein can be performed in different orders.

Having now described some illustrative implementations, it is apparent that the foregoing is illustrative and not limiting, having been presented by way of example. Features that are described herein in the context of separate implementations can also be implemented in combination in a single embodiment or implementation. Features that are described in the context of a single implementation can also be implemented in multiple implementations separately or in various sub-combinations. References to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any act or element may include implementations where the act or element is based at least in part on any act or element.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations inسizes, dimensions, structures, shapes and portions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

The systems and methods described herein may be embodied in other specific forms without departing from the characteristics thereof. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

Systems and methods described herein may be embodied in other specific forms without departing from the characteristics thereof. For example, descriptions of positive and negative electrical characteristics may be reversed. For example, elements described as negative elements can instead be configured as positive elements and elements described as positive elements can instead by configured as negative elements. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A power module for a drivetrain of an electric vehicle, the power module comprising:
   a first polarity terminal having a first surface and a second surface;
   an isolation layer having a first surface and a second surface, the first surface of the isolation layer coupled with the second surface of the first polarity terminal;
   a second polarity terminal having a first surface and a second surface, the first surface of the second polarity terminal coupled with the second surface of the isolation layer;
   a high side switch;
   a first current path that electrically couples the first polarity terminal with the high side switch;
   a low side switch;
   a second current path that electrically couples the second polarity terminal with the low side switch;
   a power loop formed from the first current path and the second current path;
   the power loop having an overlapping current path formed from the first current path disposed in parallel with respect to the second current path with the first polarity terminal of the first current path disposed parallel with respect to the second polarity terminal of the second current path; and the power loop having an overall inductance value equal to a sum of a self-inductance of the first current path and a self-inductance of the second current path minus a mutual inductance value of the overlapping current path.

2. The power module of claim 1, further comprising:
an output terminal coupled to the first polarity terminal through the first current path; and
the output terminal coupled to the second polarity terminal through the second current path.

3. The power module of claim 1, further comprising:
the first polarity terminal disposed at a first end of the power module;
the second polarity terminal disposed at the first end of the power module;
the first polarity terminal disposed adjacent with respect to the second polarity terminal; and
the first polarity terminal disposed parallel with respect to the second polarity terminal.

4. The power module of claim 1, wherein:
the low side switch includes four switching elements.

5. The power module of claim 1, wherein:
the low side switch includes a first switching element, a second switching element, a third switching element, and a fourth switching element;
a first gate terminal is coupled with the first switching element and a second switching element; and
a second gate terminal is coupled with a third switching element and a fourth switching element.

6. The power module of claim 1, wherein:
the high side switch includes four switching elements coupled in a parallel arrangement.

7. The power module of claim 1, wherein:
the high side switch includes a first switching element, a second switching element, a third switching element, and a fourth switching element;
a first gate terminal is coupled with the first switching element and the second switching element; and
a second gate terminal is coupled with the third switching element and the fourth switching element.

8. The power module of claim 1, comprising:
a housing disposed on an outer surface of the power module, the housing including a lead frame and an open window area to expose an output terminal of the power module.

9. The power module of claim 1, further comprising:
a housing disposed on an outer surface of the power module, the housing formed on the power module through a transfer molding technique.

10. The power module of claim 1, further comprising:
a first output terminal coupled with the first polarity terminal and the second polarity terminals; and
a second output terminal coupled with the first polarity terminal and the second polarity terminal.

11. The power module of claim 1, further comprising:
a trace substrate that electrically couples the first polarity terminal with the high side switch; and
the trace substrate electrically couples the second polarity terminal with the low side switch.

12. The power module of claim 1, further comprising:
a trace substrate that electrically couples at least one terminal of the high side switch with at least one terminal of the low side switch.

13. The power module of claim 1, further comprising:
a trace substrate that electrically couples the high side switch and the low side switch with an output terminal.

14. The power module of claim 1, further comprising:
the power module disposed in a drivetrain and the drivetrain disposed in an electric vehicle.

15. A method of providing a power module for a drivetrain of an electric vehicle, the method comprising:
providing a first polarity terminal having a first surface and a second surface;
disposing an isolation layer having a first surface and a second surface such that the first surface of the isolation layer is coupled with the second surface of the first polarity terminal;
coupling a second polarity terminal having a first surface and a second surface such that the first surface of the second polarity terminal is coupled with the second surface of the isolation layer;
providing a high side switch;
electrically coupling the first polarity terminal to the high side switch through a first current path;
providing a low side switch;
electrically coupling the second polarity terminal to the low side switch through a second current path;
forming a power loop from the first current path and the second current path;
the power loop having an overlapping current path formed from the first current path disposed parallel with respect to the second current path with the first polarity terminal of the first current path disposed parallel with respect to the second polarity terminal of the second current path; and
the power loop having an overall inductance value equal to a sum of a self-inductance of the first current path and a self-inductance of the second current path minus a mutual inductance value of the overlapping current path.

16. The method of claim 15, further comprising:
disposing the first polarity terminal at a first end of the power module;
disposing the second polarity terminal at the first end of the power module;
positioning the first polarity terminal adjacent with respect to the second polarity terminal; and
positioning the first polarity terminal parallel with respect to the second polarity terminal.

17. The method of claim 15, further comprising:
forming the low side switch having a first switching element, a second switching element, a third switching element, and a fourth switching element;
coupling a first gate terminal with the first switching element and the second switching element; and
coupling a second gate terminal with the third switching element and the fourth switching element.

18. The method of claim 15, further comprising:
forming the high side switch having a first switching element, a second switching element, a third switching element, and a fourth switching element;
coupling a first gate terminal with the first switching element and the second switching element; and
coupling a second gate terminal with the third switching element and the fourth switching element.

19. The method of claim 15, further comprising:
coupling at least one terminal of the high side switch with at least one terminal of the low side switch through a trace substrate; and
coupling the high side switch and the low side switch with an output terminal through the trace substrate.

20. An electric vehicle, comprising:
a power module for a drivetrain of the electric vehicle, the power module comprising:
- a first polarity terminal having a first surface and a second surface;
- an isolation layer having a first surface and a second surface, the first surface of the isolation layer coupled with the second surface of the first polarity terminal;
- a second polarity terminal having a first surface and a second surface, the first surface of the second polarity terminal coupled with the second surface of the isolation layer;
- a high side switch;
- a first current path that electrically couples the first polarity terminal to the high side switch;
- a low side switch;
- a second current path that electrically couples the second polarity terminal to the low side switch;
- a power loop formed from the first current path and the second current path;
- the power loop having an overlapping current path formed from the first current path disposed in parallel with respect to the second current path with the first polarity terminal of the first current path disposed parallel with respect to the second polarity terminal of the second current path; and
- the power loop having an overall inductance value equal to a sum of a self-inductance of the first current path and a self-inductance of the second current path minus a mutual inductance value of the overlapping current path.

* * * * *